(12) United States Patent
Arnold et al.

(10) Patent No.: US 7,923,712 B2
(45) Date of Patent: Apr. 12, 2011

(54) PHASE CHANGE MEMORY ELEMENT WITH A PERIPHERAL CONNECTION TO A THIN FILM ELECTRODE

(75) Inventors: John Christopher Arnold, North Chatham, NY (US); Lawrence Alfred Clevenger, LeGrangeville, NY (US); Timothy Joseph Dalton, Ridgefield, CT (US); Michael Christopher Gaidis, Wappingers Falls, NY (US); Louis L. Hsu, Fishkill, NY (US); Carl John Radens, LaGrangeville, NY (US); Keith Kwong Hon Wong, Wappingers Falls, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/492,618

(22) Filed: Jun. 26, 2009

(65) Prior Publication Data

US 2010/0001253 A1  Jan. 7, 2010

Related U.S. Application Data

(62) Division of application No. 11/394,263, filed on Mar. 30, 2006, now abandoned.

(51) Int. Cl.
*H01L 29/02* (2006.01)
(52) U.S. Cl. .................. 257/2; 257/4; 257/E45.002
(58) Field of Classification Search .......... 257/2, 4, 257/E31.029
See application file for complete search history.

(56) References Cited

U.S. PATENT DOCUMENTS

| | | | |
|---|---|---|---|
| 6,649,928 B2 | 11/2003 | Dennison | |
| 6,764,894 B2 | 7/2004 | Lowrey | |
| 6,791,102 B2 | 9/2004 | Johnson | |
| 6,791,107 B2 | 9/2004 | Gill | |
| 6,800,563 B2 | 10/2004 | Xu | |
| 6,815,704 B1 | 11/2004 | Chen | |
| 7,504,652 B2 | 3/2009 | Huang | |
| 2004/0113135 A1 | 6/2004 | Wicker | |
| 2006/0011902 A1 | 1/2006 | Song | |
| 2007/0012905 A1 * | 1/2007 | Huang | ........................ 257/2 |

FOREIGN PATENT DOCUMENTS

| | | |
|---|---|---|
| CN | 200061000164.7 | 1/2006 |
| CN | 1 2007100891449 | 8/2009 |

OTHER PUBLICATIONS

CN1__200610001614.7 Prior Art Reference Cited 200610001614__SIPO__DETAIL.
Stefan Lai et al. in "Current Status of the Phase Change Memory and its Future" Electron Devices Meeting, 2003. IEDM 2003 Technical Digest. IEEE International Dec. 8-10, 2003.

* cited by examiner

*Primary Examiner* — Sue Purvis
*Assistant Examiner* — Selim Ahmed
(74) *Attorney, Agent, or Firm* — Graham S. Jones, II; Daniel P. Morris; Robert M. Trepp

(57) ABSTRACT

A PCM cell structure comprises a first electrode, a phase change element, and a second electrode, wherein the phase change element is inserted in between the first electrode and the second electrode and only the peripheral edge of the first electrode contacts the phase change element thereby reducing the contact area between the phase change element and the first electrode and thereby increasing the current density through the phase change element and effectively inducing the phase change at lower levels of current and reduced programming power.

20 Claims, 22 Drawing Sheets

PHASE CHANGE MEMORY ELEMENT WITH A PERIPHERAL CONNECTION TO A THIN FILM ELECTRODE

This application is a division of U.S. patent application entitled "Phase Change Memory Element with a Peripheral Connection to a Thin Film Electrode", Ser. No. 11/394,263 filed 30 Mar. 2006, now abandoned.

BACKGROUND

The present invention relates to memory devices, and more particularly phase Change Memory (PCM) cell structures.

Recently nonvolatile chalcogenide Random Access Memory (RAM) devices, made of the germanium-antimony-tellurium (Ge2Sb2Te5) chalcogenide material, have been regarded as the most promising next-generation memory devices. The term "chalcogen" refers to the Group VI elements of the periodic table; and the term "chalcogenide" refers to alloys containing at least one of these elements, e.g. the alloy of germanium, antimony, and tellurium, etc. Chalcogenide materials have been used in PCM devices, especially in both rewritable Compact Disk (CD) and Digital Video Disk or Digital Versatile Disc (DVD) devices. This kind of memory when introduced into semiconductor chips has many advantages over others in areas, e.g. scalability, high sensing margin, low energy consumption, and cycling endurance. In a common design for chalcogenide memory cells, the data is stored in a flat chalcogenide layer that can be deposited near the end of the CMOS interconnect process making it ideal for embedded applications.

A chalcogenide memory element can be programmed and reprogrammed into high/low resistance states. In short, when a chalcogenide memory element is in the amorphous phase (or so called RESET state) it has high resistance; when it is in the crystalline phase, it shows low resistance (or called SET state). The resistance ratio between two SET and RESET states can be greater than 1,000 times, which provides high sensing margins.

FIG. 1 shows the current voltage (I-V) characteristics of the germanium-antimony-tellurium (Ge2Sb2Te5) chalcogenide material which is bistable. When the applied voltage V of the amorphous chalcogenide material exceeds the threshold voltage (Vt), threshold switching occurs and the material turns from an "OFF" state with low current level into a dynamic "ON" state with high current. In the ON state, the carrier concentration is high and the resistance is as low as that in the crystalline state.

Adequate energy must be driven into the device to change state from the "RESET" state to the "SET" state in the dynamic ON state for a device in the RESET state. FIG. 2 shows that to ensure SET programming of a device the temperature must be above the crystallization temperature (Tx) and which must be held for a certain period of time (t2).

On the other hand, FIG. 2 also shows that for a "reset program" or changing a cell from SET to RESET, enough energy must be driven into the Chalcogenide device and the local temperature must rise above the melting temperature (Tm). A shorter period of time should be spent above Tm to avoid heating the surrounding materials. It is critical that a rapid quenching interval (t1) is required after the local heating interval to return to the amorphous phase (RESET).

Because the rate of Joule heating of the phase change material during the RESET and SET cycles is determined largely by current density, reducing the contact area between the phase change material and the adjacent electrode is sufficient to reduce the switched volume. For example, during the RESET cycle, it is not necessary to melt the entire volume of phase change material if the current density, and thus Joule heating rate, and thus material temperature, is high enough to melt the material near one of the electrodes. Once enough material has been amorphized to span the breadth of the current path through the cell, the overall resistance of the cell will be high. Similarly, during the SET cycle, the overall cell resistance will fall once a sufficiently broad path of crystalline material is formed. In both cases, adjacent material may be left in the opposite state without affecting the overall cell resistance significantly.

To read a chalcogenide memory device, a "READ" voltage is applied on the device; thus permitting detection of the current difference resulting from the different device resistance. The read voltage must be lower than the threshold voltage (e.g. 1.2V) to avoid changing the state of the material.

Currently, chalcogenide devices are used in reversible (RW) optical information storage devices, e.g. CD-RW and DVD-RW disks. Compounds, e.g. a germanium-antimony-tellurium material (Ge2Sb2Te5), can change phase from amorphous to crystalline in about 50 ns after proper exposure to radiation from a laser beam. However, the crystallization speed of a germanium-antimony-tellurium material tends to decrease with thinner films. To avoid this, it is suggested that tin be doped into a Ge—Sb—Te compound to form a Ge—Sb—Sn—Te compound and increase the crystallization speed.

TABLE I

| Binary | Ternary | Quaternary |
| --- | --- | --- |
| GaSb | $Ge_2Sb_2Te_5$ | AgInSbTe |
| InSb | InSbTe | (GeSn)SbTe |
| InSe | GeSeTe | GeSb(SeTe) |
| $Sb_2Te_3$ | $SnSb_2Te_4$ | $Te_{81}Ge_{15}Sb_2S_2$ |
| GeTe | InSbGe | |

A simplified cell structure of chalcogenide PCM type of memory comprises a conventional MOS FET transfer transistor connected to a memory cell. One source/Drain (S/D) junction of the transistor is connected to a metal wire called a bit-line. The other S/D junction of the MOS FET is connected to the memory element. The gate electrode of the transistor is connected to another metal line called the word-line. The PCM element comprises a sandwich of top electrode, a bistable dielectric, and a bottom electrode. Both electrodes are made of metal or refractory metal, while the bistable dielectric is a thin layer of a chalcogenide material.

As to the cycling endurance of a chalcogenide memory element, it has been reported by Lai et al. that one can conduct more than 1E12 set/reset cycles, which is much higher than a conventional Flash memory (about 1E5). The report was made by Stefan Lai et al. in "Current Status of the Phase Change Memory and its Future" Electron Devices Meeting, 2003. IEDM 2003 Technical Digest. IEEE International 8-10 December '03, Pages: 10.1.1-10.1.4

Application of this class of PCM to a practical multi-bit memory device requires two additional characteristics beyond those discussed above as follows: the volume of switched material (i.e., the material which changes phase) must be small, so that the currents required during the Set cycles and the Reset cycles are not excessive; and the many memory cells in the multi-bit device must be sufficiently similar to each other than that good separation between the Set and Reset currents is maintained.

If the switched volume is too large relative to the technology node at which the transistors are fabricated, the power required to switch that material (particularly during the Reset cycle) will be higher than the transistors connected to the PCM device can support reliably. Simulations and other studies have suggested that appropriate dimensions for the switched material will be on the order of one half (½) or one quarter (¼) of the nominal technology node. Thus, for the 90 nm node, the memory cell will need to have characteristic dimensions in the 30-50 nm range. This is well below the lithographic capabilities defined for that technology node; and because the capacity for power delivery scales down with the technology node, it will be required that the PCM device will be sublithographic at all nodes.

Furthermore, accurate control of the memory cell dimensions is essential. If the dimensions vary excessively, on an all-cells/all-die/all-days basis, there is a risk that the current applied during the Reset pulse may actually set the material in some cells, and vice-versa.

Thus, the principal challenge in fabricating practical memory devices is in producing and controlling dimensions well below the norms for standard photolithography.

This invention is one of several approaches designed to reduce the effective dimensions of the memory cell through additional processing after lithography. Other approaches include "trimming" photoresist blocks prior to transferring their dimensions into phase change materials, depositing phase change material in holes or trenches whose sidewalls have been intentionally tapered to provide a smaller contact area at the bottom of the hole than was defined by lithography at the top, and depositing dielectric liners inside conventionally-defined holes to reduce their dimensions prior to filling them with phase change material.

Several prior art PCM cell designs have been reported. In the Lai et al. paper described above, "Current Status of the Phase Change Memory and its Future," FIGS. 7A/7B therein show configurations in which use is made of edge contact to reduce switching current. The PCM device includes a top electrode contact TEC, a top electrode TE, a chalcogenide PCM (GeSbT) layer GST, a bottom electrode BE, and a bottom electrode contact BEC. The programming current is significantly reduced by using an edge instead of conventional top and bottom electrode contact. The programmable volume in diagram 7B is much smaller than that of the conventional design.

Another prior art approach is embodied in U.S. Pat. No. 6,764,894 B2, of Lowrey entitled "Elevated Pore Phase-Change Memory." As shown in FIG. 6 of Lowrey there is Shallow trench isolation (STI) 14, a base contact 16, a conductor 18, a fill insulator 20, cup-shape lower electrode 22, sidewall spacers 24 composed of an insulator, phase change material 28 (e.g. Ge2Sb2Te5), and an upper electrode 30. The Lowrey patent states "In some embodiments, a thermally efficient device structure provides for improved device performance by reducing the required power for device programming. The programmable media volume, represented by the phase-change layer 28, is nearly surrounded by thermal insulation."

U.S. Pat. No. 6,800,563 of Xu entitled "Forming Tapered Lower Electrode Phase-Change Memories" shows in FIG. 7 thereof a conical substrate, a lower electrode, an upper electrode, and phase change material. In Xu a tapered lower electrode stack is created by isotropic etching. That design provides a relatively small surface area contacting with the phase change material. When current is flowing through the electrodes, the current density at the tapered contact is very high leading to a rapid rise of temperature there. The Xu patent indicates that the tapered shape of the lower electrode reduces the contact area between the electrode and the phase-change material. This increases the resistance at the point of contact, increasing the ability of the lower electrode to heat the PCM layer.

U.S. Pat. No. 6,649,928, of Dennison entitled "Method to Selectively Remove One Side of a Conductive Bottom Electrode of a Phase-Change Memory Cell and Structure Obtained Thereby," relates to a PCM device including a lower electrode disposed in a recess of a first dielectric. The lower electrode comprises a first side and a second side. The first side communicates to a volume of phase change material. The second side has a length that is less than the first side. A second dielectric, which may overlie the lower electrode, has a shape that is substantially similar to the lower electrode. The method of the Dennison invention includes providing a lower electrode material in a recess and removing at least a portion of the second side.

U.S. Pat. No. 6,791,102 of Johnson entitled "Phase Change Memory" describes a PCM device with phase change material having a bottom portion, a lateral portion, and a top portion. The PCM device may include a first electrode material contacting the bottom portion and the lateral portion of the phase change material and a second electrode material contacting the top portion of the phase change material. A first conductive material is cup-shaped and surrounds the bottom portion and the lateral portion of the phase change material. A lower electrode which is cup shaped, circular, or ring-shaped may be formed surrounding and contacting the lateral and bottom surfaces of the PCM memory material.

U.S. Pat. No. 6,815,704 of Chen entitled "Phase Change Memory Device Employing Thermally Insulating Voids" describes a PCM device, and method of making the same, that includes contact holes formed in insulation material that extend down to and expose source regions for adjacent FET transistors. Lower electrodes are disposed in the holes with surfaces defining openings narrowed along a depth of the opening by spacers. A layer of phase change material is disposed along the spacer material surfaces and along the lower electrodes. Upper electrodes are formed in the openings and on the phase change material layer. Voids are formed in the spacer material to impede heat from the phase change material from conducting through the insulation material. For each contact hole, the upper electrode and phase change material layer form an electrical current path that narrows as the current path approaches the lower electrode. The electrical current pulse flowing through the upper electrode generates heat, concentrated in the lower portion thereof, where current density is greatest. The narrow current path of the upper electrode produces a maximum current density and maximum heat generation, adjacent to the memory material to be programmed, minimizing the amplitude and duration of electrical programming for the PCM device. The spacers surrounding the heating electrode increase the distance and thermal isolation between heating electrodes and programming material layers from adjacent cells. An indentation sharpens the tip of the upper electrode lower portion, focusing heat generation at the chalcogenide material disposed directly between the tip and the lower electrode. In one embodiment, voids isolate the memory cells thermally.

U.S. Patent Application No. 2004/0113135 by Wicker entitled "Shunted Phase Change Memory" teaches that by using a resistive-film shunt to carry a shunting current around the amorphous phase change material the snapback exhibited when transitioning from the reset state or amorphous phase of a phase change material, may be largely reduced or eliminated. The resistance from the resistive-film shunt may be significantly higher than the set resistance of the memory element so that the phase change resistance difference is detectable. The resistive-film shunt may be sufficiently resistive that it heats the phase change material and causes the appropriate phase transitions without requiring a dielectric breakdown of the phase change material. The resistance of the resistive-film shunt may be low enough so that when voltages are present which approach the threshold voltage of the memory element, the resistive-film shunt heats significantly. In other words, the resistance of the resistive-film shunt may be higher than the set resistance and lower than the reset resistance of the memory.

SUMMARY OF THE INVENTION

In a first aspect of the invention, an apparatus is provided. A first embodiment of the apparatus comprises a memory cell with a reduction in switched volume through distribution of the phase change material in a thin conformal layer in contact with the edge of a thin film lower electrode which lines a conventionally-defined hole with the phase change material being either a round, or square, configuration or an alternative convenient shape.

Because effective heating of the phase change material requires only a high current density, reducing the contact area between the phase change material and one of the electrodes is sufficient to manage the power requirements. Thus, for example, good performance can be obtained from a long, narrow cylinder of phase change material, because the cross-sectional area is small even if the length, and therefore total volume of material, is large. Similarly, a conical or pyramidal structure can form an efficient PCM cell if the contact area between one electrode and the phase change material is small.

In accordance with this invention, the contact area between the phase change material and one electrode (typically the "upper" electrode) is made small by confining the phase change material to the outer perimeter of a feature of some convenient shape (typically but not necessarily cylindrical). The remainder of the feature cross-section is occupied by a dielectric material.

If, for example, the feature is a cylinder of diameter d and the adjacent electrode completely spans the end of the cylinder, the contact area between electrode and phase change material will be given by $\pi dt$, where t is the thickness of the phase change material as measured perpendicular to the wall of the feature. Because t is typically controlled by film deposition rather than lithography, t can be made much smaller than d and therefore the contact area can be much smaller than the $\pi(d/2)^2$ which a solid cylinder of phase change material would have. Similar arguments apply for non-cylindrical features which may be of square, elliptical, star shaped, or other alternative configurations.

In accordance with an aspect of this invention, a phase change memory cell structure comprises a phase change element, and a thin film electrode having a periphery. The phase change element is electrically connected to at least a portion of the periphery of the thin film electrode.

In accordance with another aspect of this invention a method of forming a phase change memory cell structure comprises forming a thin film electrode having a periphery, and forming a phase change element over said periphery of said thin film electrode. The phase change element is electrically connected to at least a portion of the periphery of the thin film electrode.

BRIEF DESCRIPTION OF THE DRAWINGS

FIG. 2, shows that to ensure RESET PROGRAMMING or to change a cell from SET to RESET, sufficient energy must also be driven into the chalcogenide PCM device and the local temperature must be raised to above the melting temperature (Tm).

FIGS. 3A-10A show plan views and FIGS. 3B-10B show corresponding sectional, elevation views taken along line B-B' in FIGS. 3A-10A of a Phase Change Memory (PCM) cell structure during performance of a process for manufacture of the PCM cell structure of this invention as illustrated by the flow chart shown in FIG. 11.

FIGS. 13A-18A show plan views and FIGS. 13B-18B show corresponding sectional, elevational views taken along line B-B' in FIGS. 13A-18B of an alternative PCM cell structure during the performance of a process for manufacture of the PCM cell structure of this invention as illustrated by the flow chart shown in FIG. 19. FIG. 13A is a plan view of a PCM device after performing step BA in FIG. 19. FIG. 13B is a sectional view taken along line B-B' in FIG. 13A.

FIGS. 18A and 18B show the PCM device of FIGS. 17A and 17B after performing step BG in FIG. 19.

DETAILED DESCRIPTION

The present invention provides an improved Phase Change Memory (PCM) cell structure. By reducing the contact area between the phase change material of the PCM cell and one of the electrodes connected thereto, the resulting high current density can induce the necessary heating and phase changes within the PCM effectively with relatively low current (and, thus, low operating power).

Prior art structures often attempt to realize this method of operating power reduction, but are hampered by complex integration schemes and designs that can result in poor uniformity across arrays of the memory elements. Uniformity is necessary to ensure each element can be switched with the same characteristic current pulse, and, although less difficult with PCM, to ensure that each element's readout resistance is in a desired range for a "high" state and a "low" state—without the two states overlapping. Complex integration schemes are undesirable because they are expensive, and offer greater chance of yield loss. This invention provides an elegant means of creating a high-current-density structure with extremely repeatable and uniform characteristics, and with a minimum of process steps to reduce complexity and yield loss.

FIGS. 3A-10A show plan views of a device 8 during performance of Steps A-H in FIG. 11 and FIGS. 3B-10B show corresponding sectional, elevation views of the device 8 taken along line B-B' in FIGS. 3A-10A.

Step A

Figure 1:
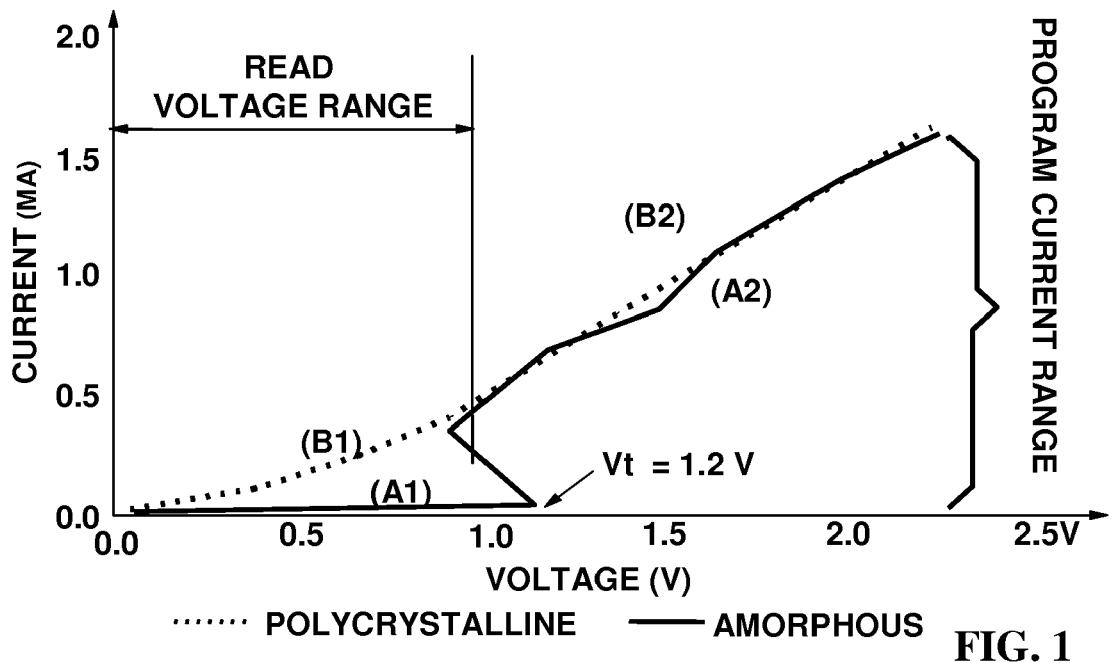
FIG. 1 shows the current voltage (I-V) characteristics of Germanium-Antimony-Tellurium (Ge2Sb2Te5) chalcogen material which is bistable.
Figure 2:
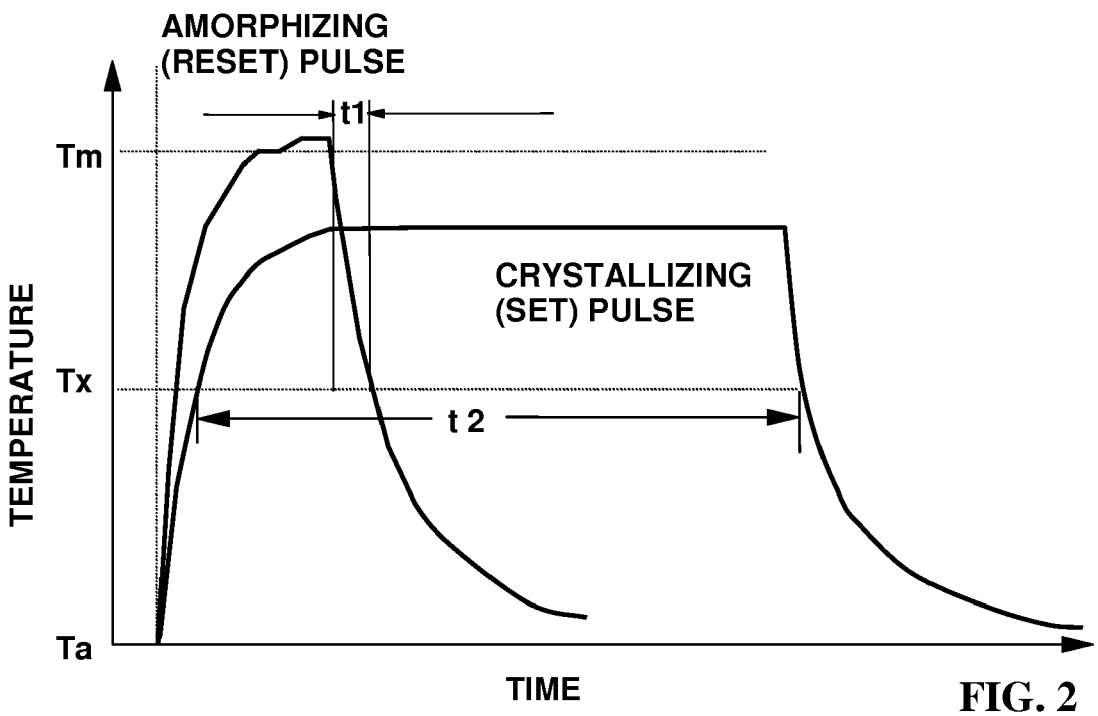
FIG. 2 shows that to ensure SET PROGRAMMING of a chalcogenide PCM device the temperature must be above the crystallization temperature (Tx) and the temperature must be held for a certain minimum period of time (t2).
Figure 3A:
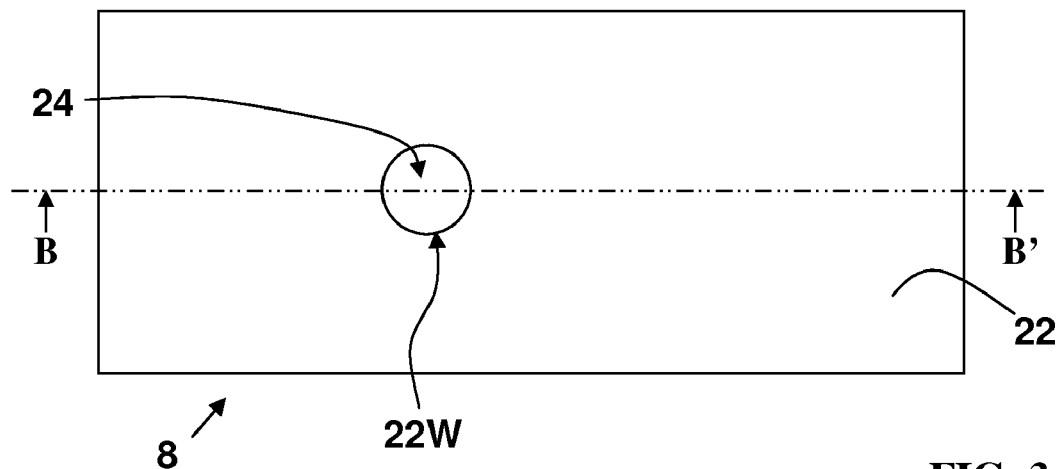
Figure 3B:
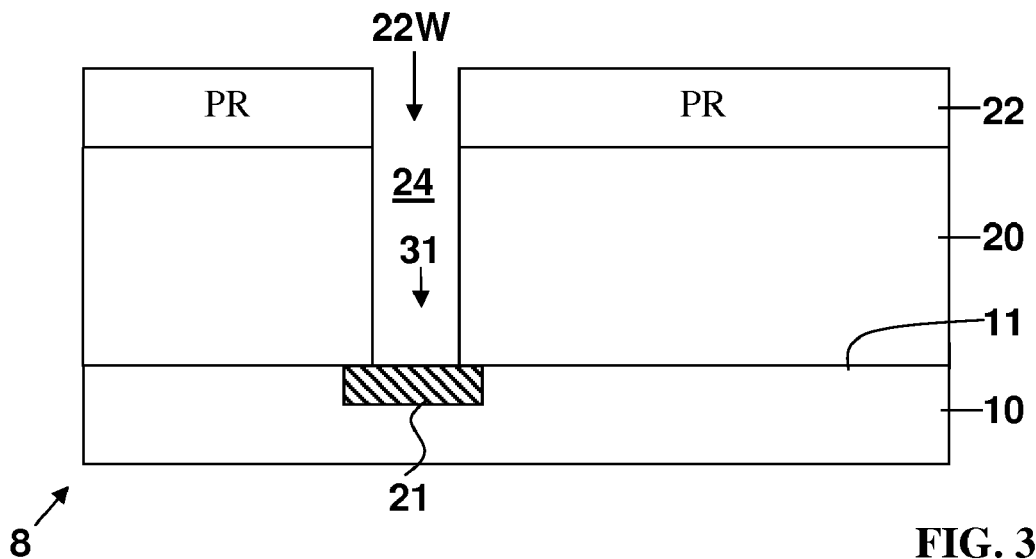
Figure 10A:
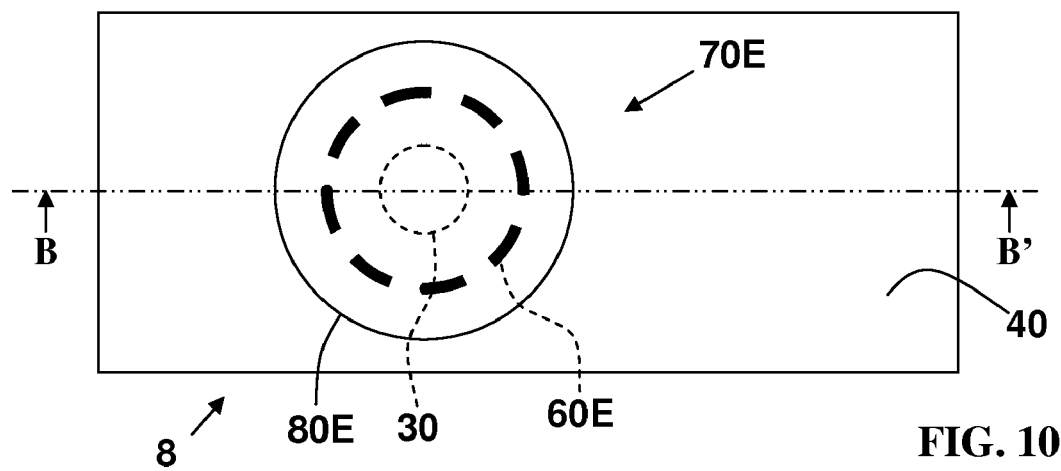
Figure 10B:
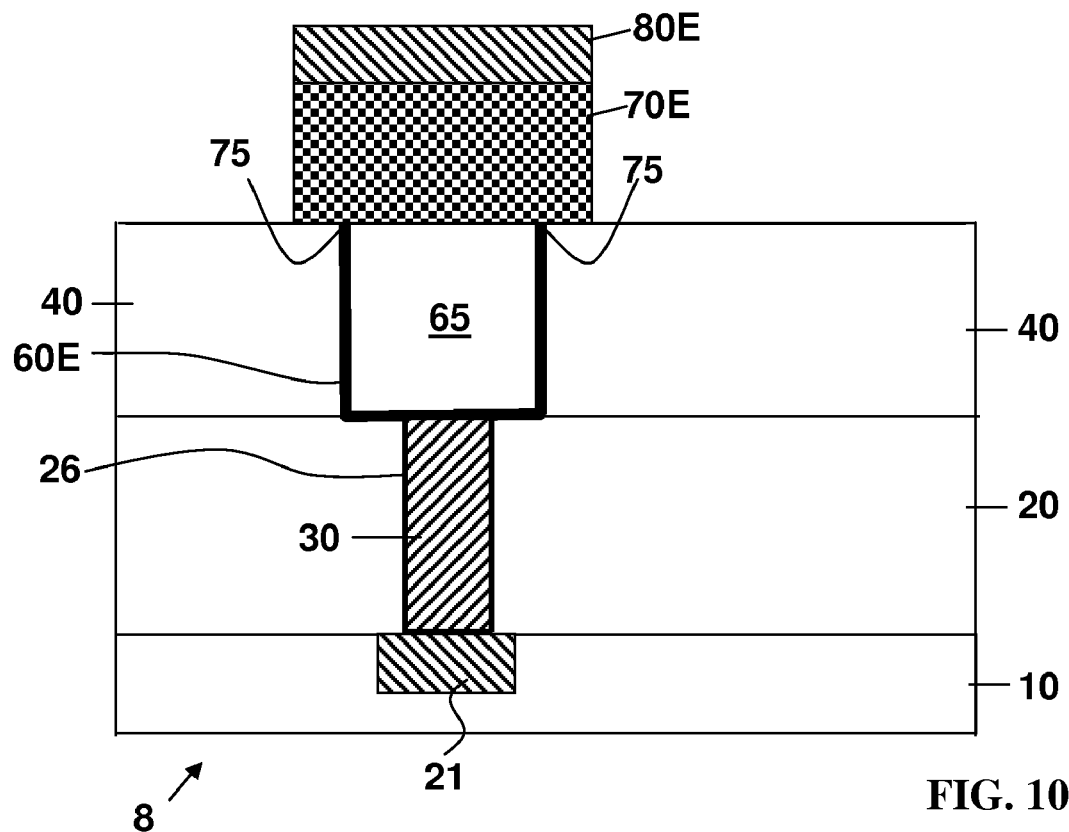
Figure 10A:
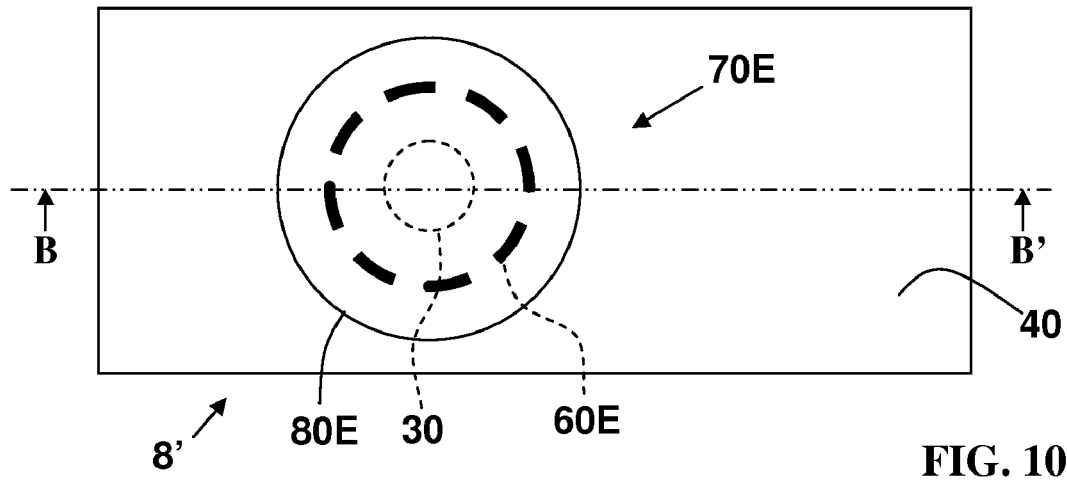
Figure 10B:
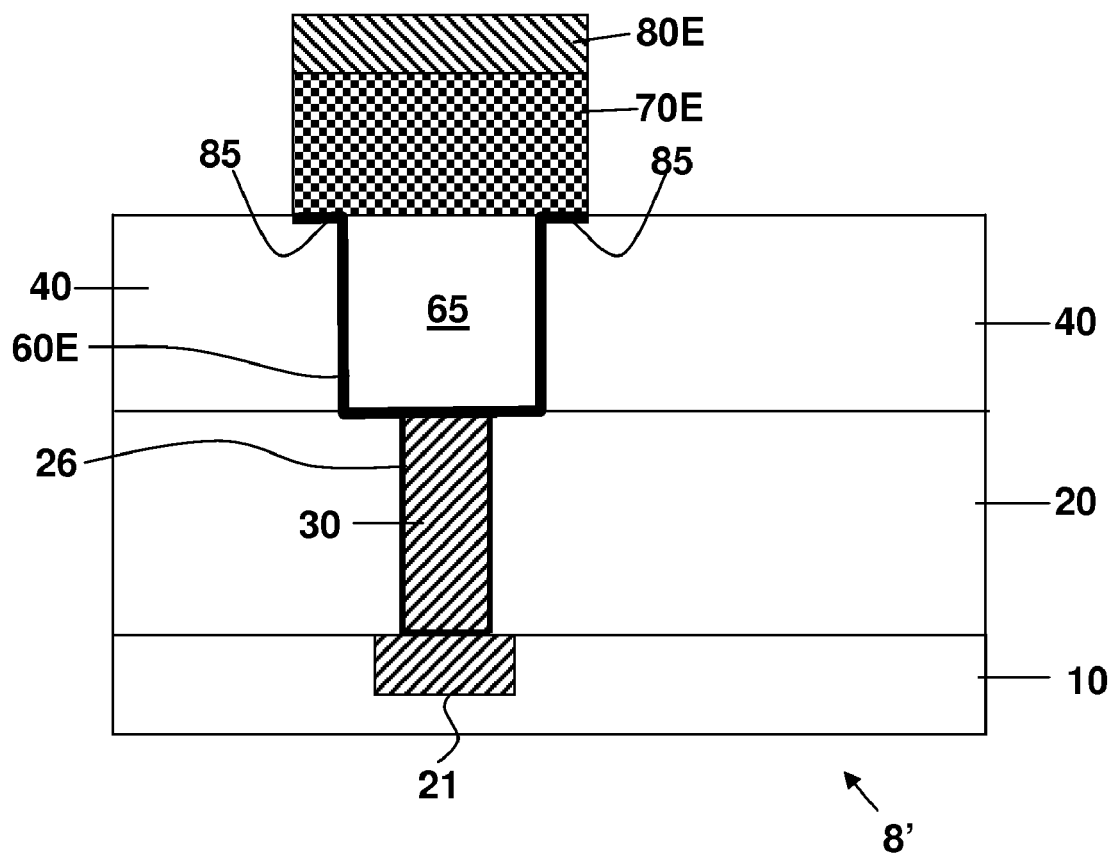
Figure 11:
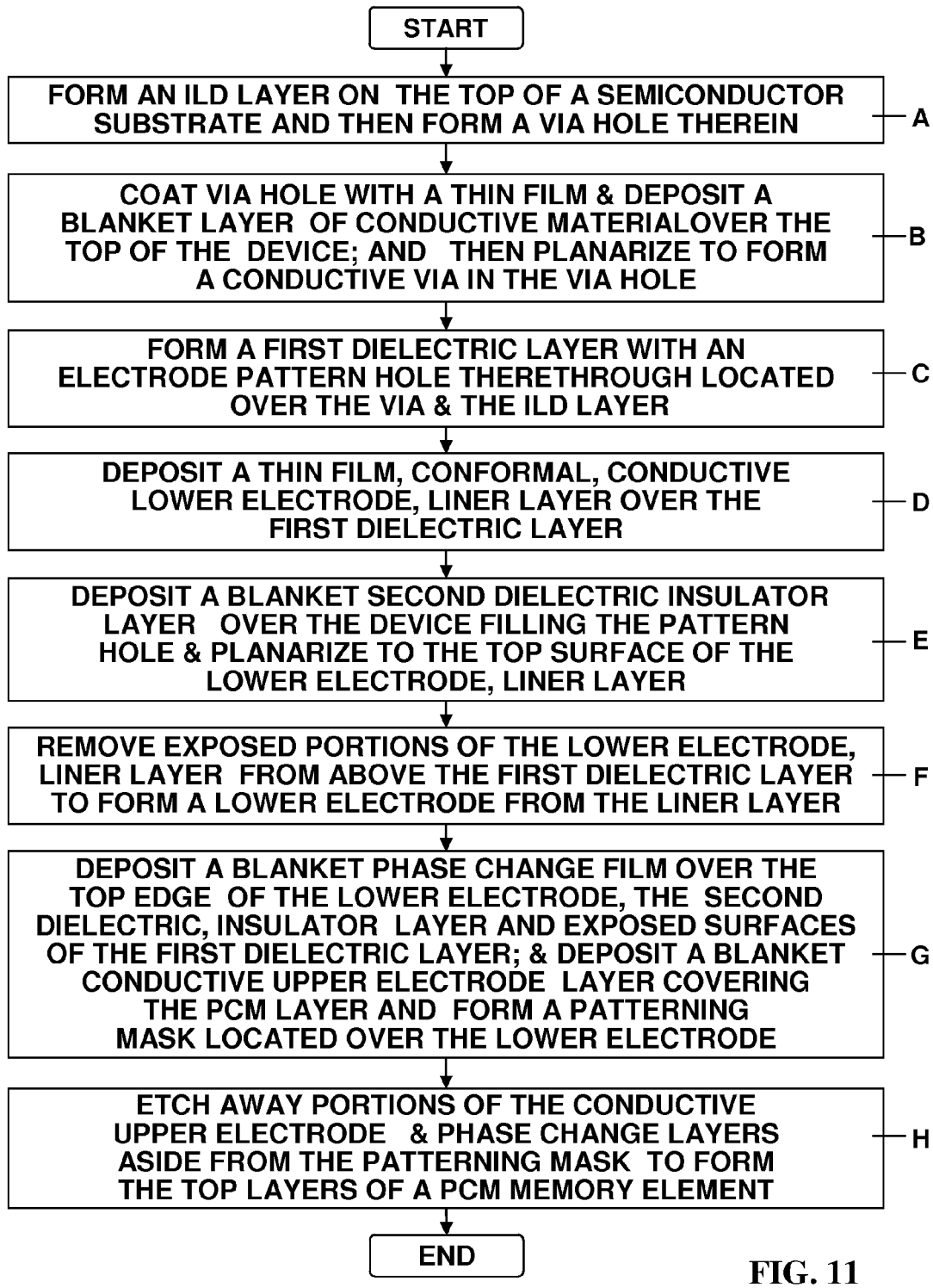
FIG. 11 is a flow chart of a process in accordance with this invention for manufacturing the PCM cell structure shown in FIGS. 10A and 10B.
Figure 12:
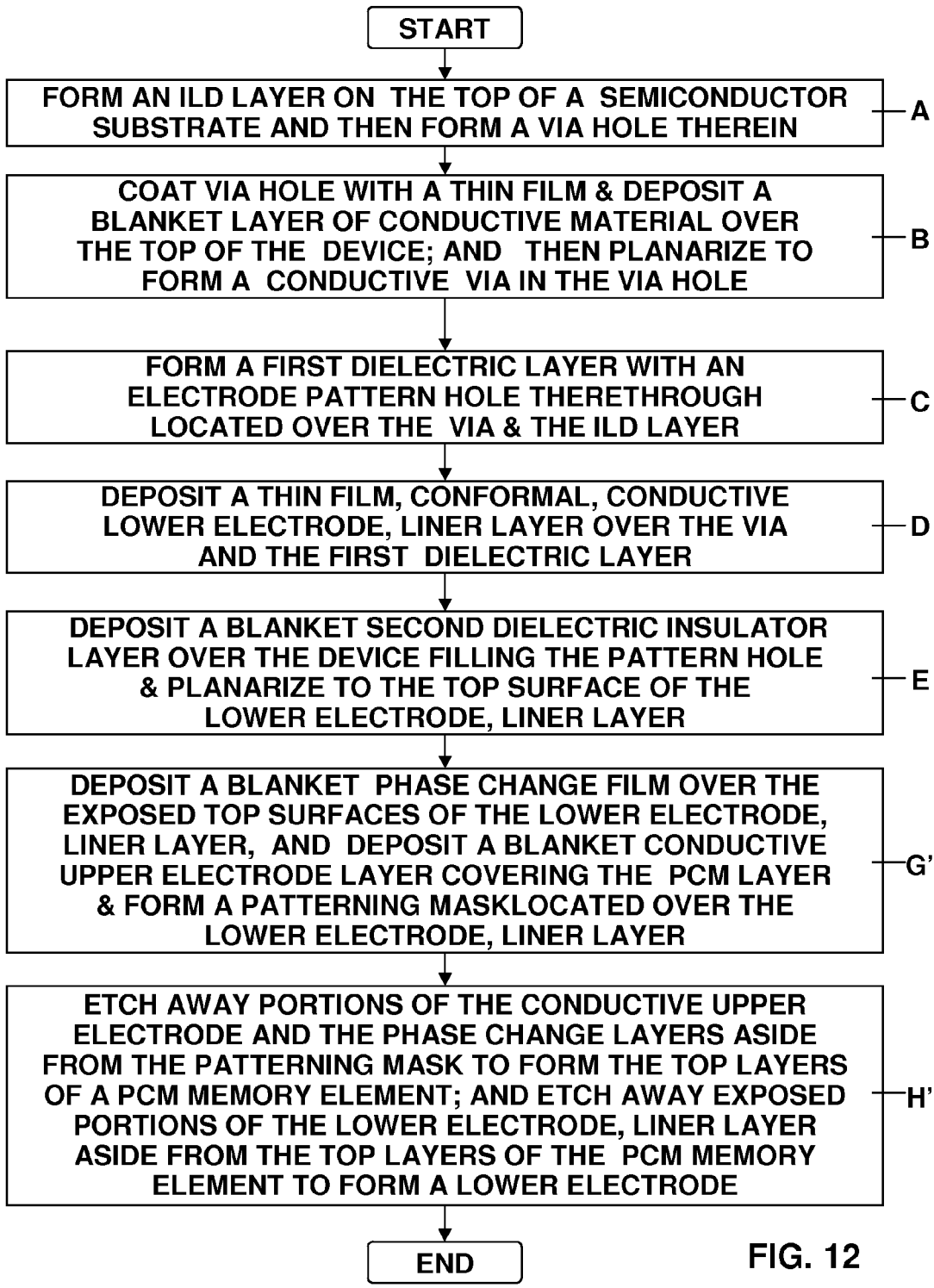
FIG. 12 is a flow chart of an alternative process in accordance with this invention for manufacturing a PCM cell structure as shown in FIGS. 10A' and 10B'.

Step A is an early stage of the process illustrated by the flow charts of FIGS. 11 and 12 for manufacturing a PCM device 8 shown in an initial stage of manufacture in FIGS. 3A and 3B. FIG. 3A is a plan view and FIG. 3B is a sectional view taken along line B-B' in FIG. 3A of the PCM device 8 after performing step A. FIG. 11 is a flow chart for showing a process flows for producing the PCM device 8 shown in FIGS. 10A and 10B. FIG. 12 is a flow chart for an alternative process flow for producing the PCM device 8' shown in FIG. 1A' and 10B'.

In step A, referring to FIGS. 3B, 11 and 12, at first an interlevel dielectric (ILD) insulator layer 20 is formed over the top surface of a substrate 10 (e.g. a semiconductor chip). Next, a photolithographic mask 22, e.g. photoresist (PR), with window 22W therethrough shown in FIGS. 3A and 3B is formed over the ILD insulator layer 20. Then by etching through the window 22W, a via hole 24 is formed in the ILD insulator layer 20. The via hole 24 extends down through the dielectric insulator 20 to the top surface of an element 21 which is located in the substrate 10 to provide contact with circuitry in device 8, not shown for convenience of illustration The element 21 comprises an underlying circuit element such as an electrical conductor; a source contact, a drain contact, or a gate contact of a CMOS transistor, or any other portion of a memory chip which requires electrical contact with the phase change memory element The depth of the element 21 and the location of the bottom of the via hole 24 is simply illustrative that the depth is variable depending upon the depth of the electrical element 21 which is to be connected to the via 130 The ILD insulator layer 20 comprises a material, e.g. silicon dioxide (SiO2), or other low-k dielectric insulator materials.

In accordance with conventional semiconductor electronic devices, underlayer structures including conventional microelectronics devices and multilevel interconnect structures may be included in the substrate 10 prior to commencing the process of this invention.

Step B

Figure 4A:
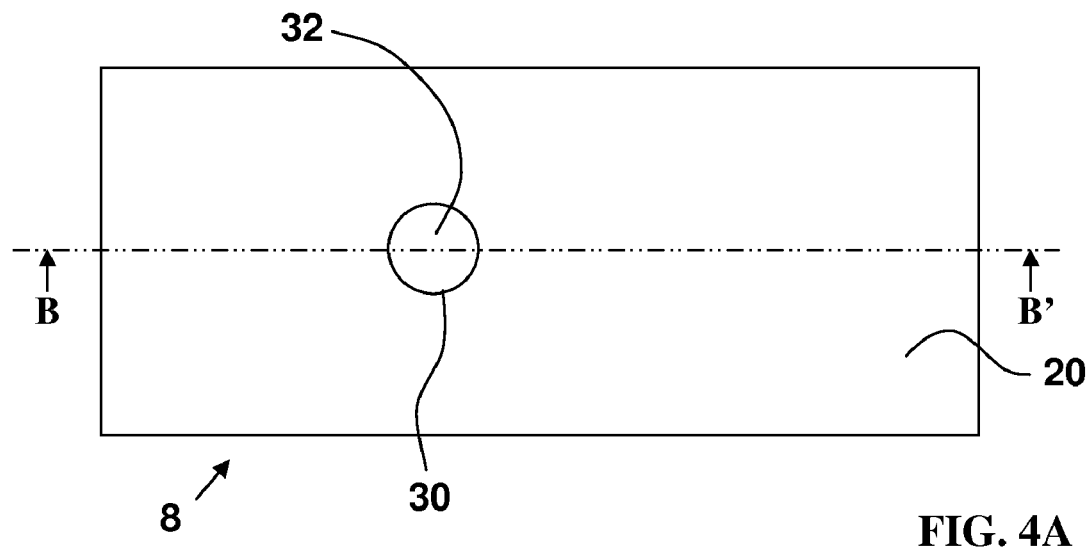
Figure 4B:
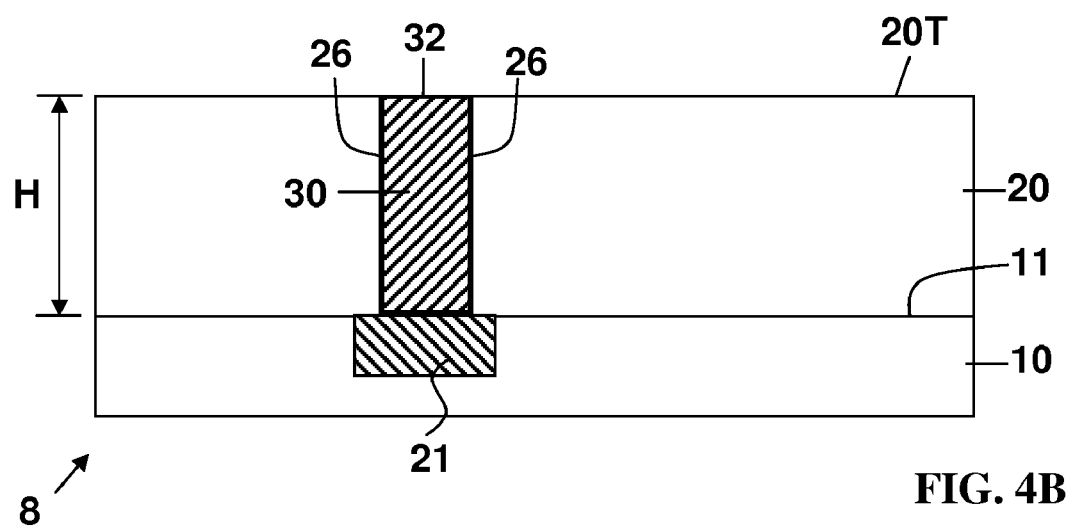

FIGS. 4A and 4B show respective plan and cross-sectional views of device 8 of FIGS. 3A and 3B after coating the bottom surface and sidewalls of the via hole 24 with a thin film 26 composed of a conventional material, e.g. titanium, followed by filling the via hole 24 by depositing a blanket layer of conductive material 30 over the top of device 8 and the thin film 26, thereby overfilling the via hole 24. Next, the PCM device 8 is planarized leaving an interconnect, conductive via 30 inside the space defined by the thin film 26 in the via hole 24 with the top surface 32 of the via 30 being generally coplanar with the top surface 20T of the ILD insulator layer 20. The interconnect, conductive via 30 is composed of a conductive metallic material, e.g. tungsten (W), via formed by lithographic patterning and a dry etch, e.g. Reactive Ion Etch (RIE). The vertical height H of the via 30 may be in the range of 5 nm to 1 μm, preferably 100 nm to reduce capacitive coupling and defect-induced leakage between other devices on the substrate 10 which are not shown.

In summary, the via 30 is embedded in ILD insulator layer 20 by employing a damascene process which includes anisotropic RIE masked by photoresist mask 22 with window 22W therethrough forming via hole 24 as shown in FIGS. 3A and 3B. Then as shown FIGS. 4A and 4B, the thin film 26 is deposited followed by depositing the metal conductor 30 followed by Chemical-Mechanical Planarization (CMP), or RIE etchback, as is known to those skilled in the art, on substrate 10 for the first embodiment of the inventive structure.

Step C

Figure 5A:
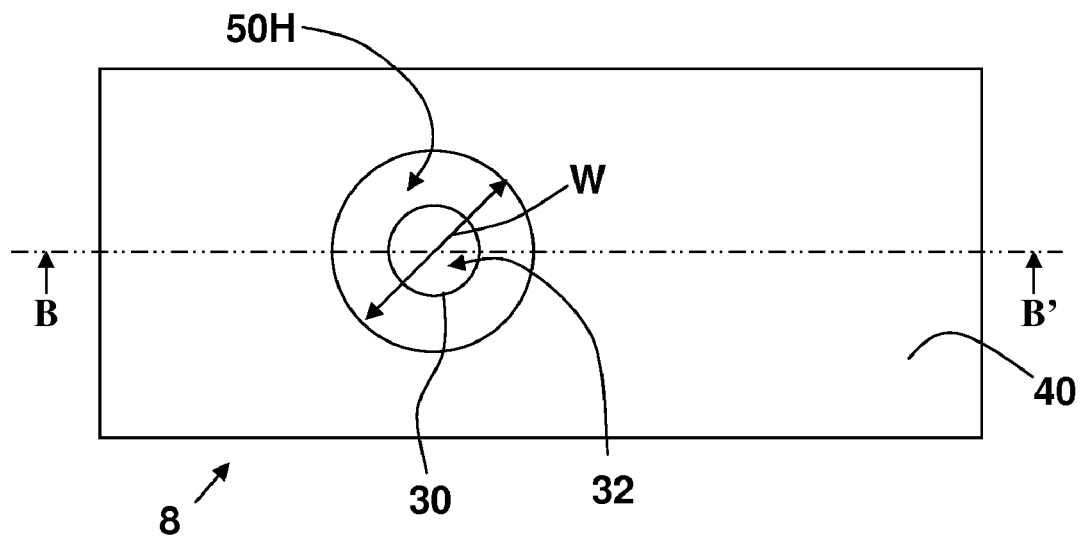
Figure 5B:
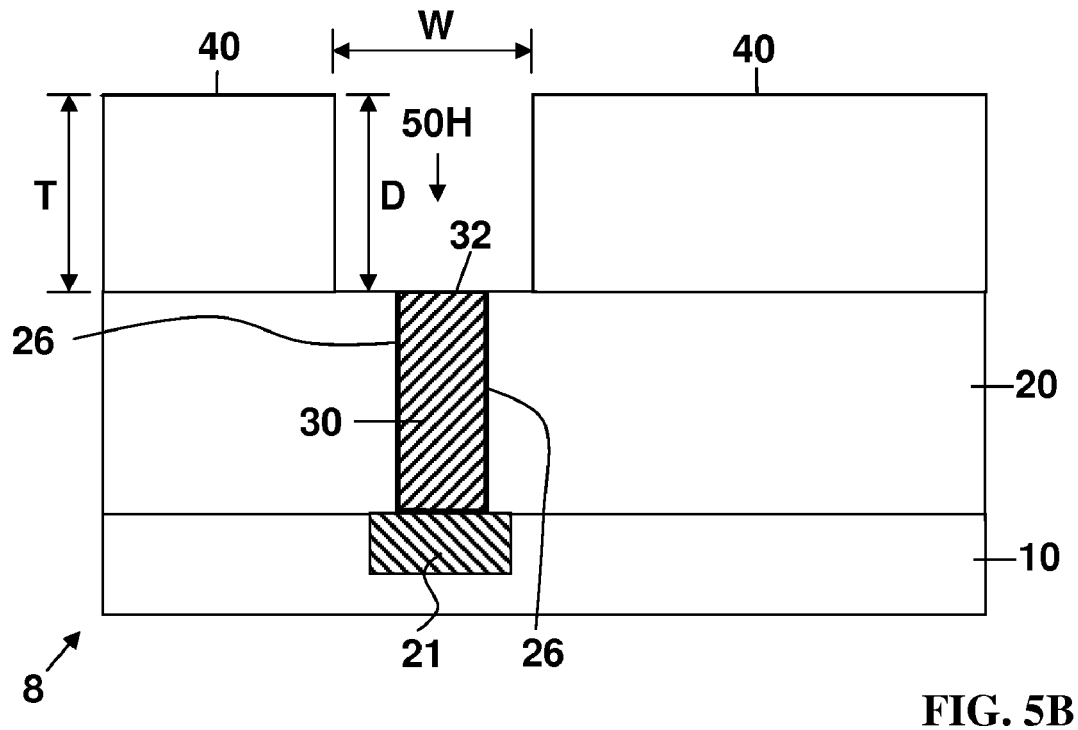

FIGS. 5A and 5B show plan and cross-sectional views of the structure of FIGS. 4A and 4B after forming a first dielectric insulator layer 40 (e.g. silicon dioxide or other low-k material) with a thickness T over top surfaces of the via 30, the thin film 26 and the ILD layer 20. Then a lower electrode patterning hole 50H is formed in the first dielectric insulator layer 40 over the top surface 32 of the via 30 to provide a form for subsequent step of damascene processing of an annular lower electrode 60E shown in FIGS. 10A/10B and 10A'/10B'. The step of patterning to form lower electrode pattern hole 50H is preferably performed by photolithography and anisotropic dry etching of the first dielectric insulator layer 40. The lower electrode patterning hole 50H in the first dielectric insulator layer 40 serves to expose the top surface of the conductive via 30 and the thin film 26 as well as a margin of the ILD layer 20. The depth D of the pattern hole 50H in the first dielectric insulator layer 40 is set by the thickness T of the first dielectric insulator layer 40 in the range of from about 10 nm to about 1 μm, preferably 300 nm. The width W of the pattern hole 50H (or diameter if the hole is round) can be from about 20 nm to about 1 um, preferably 200 nm.

Step D

Figure 6A:
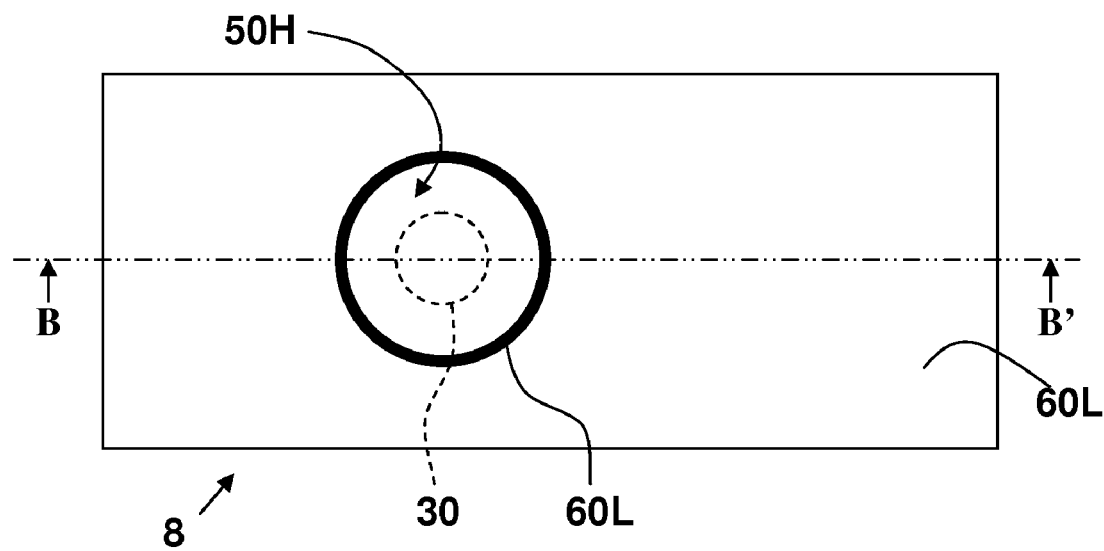
Figure 6B:
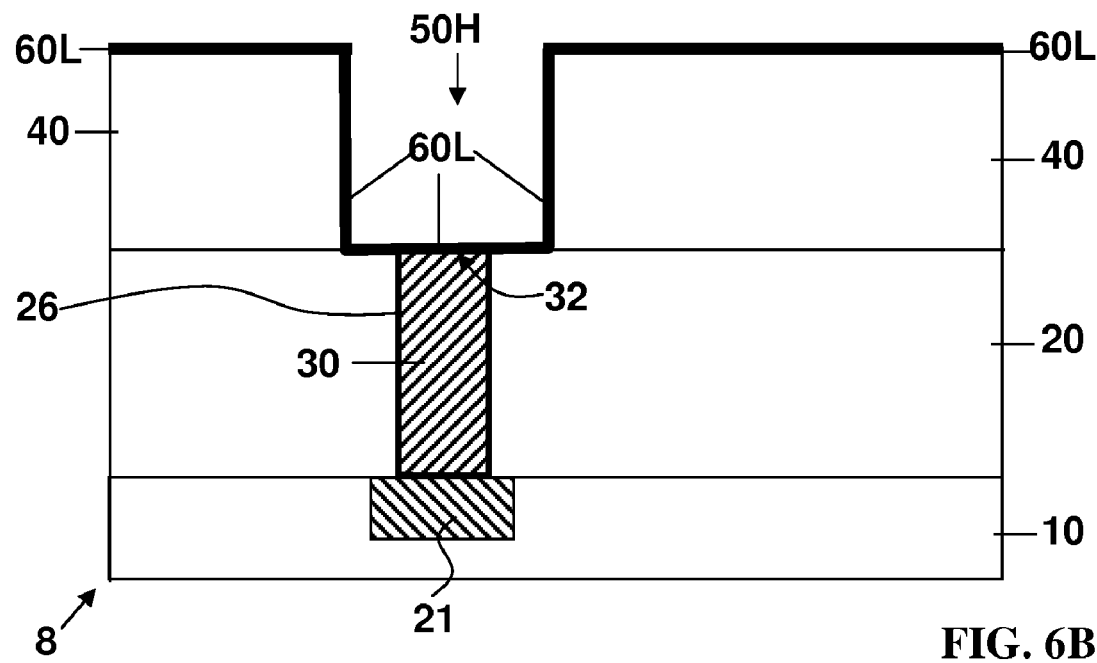

FIGS. 6A and 6B show plan and cross-sectional views of the structure of FIGS. 5A and 5B after forming a thin, conformal, conductive, lower conductor liner layer 60L on exposed surfaces of the device 8 including the top surface of the first dielectric insulator layer 40, and the sidewalls and bottom surfaces of the pattern hole 50H including the top surface 32 of the conductive via 20, the thin film 26, as well as a margin of the ILD layer 20. The lower conductor, liner layer 60L has been conformally deposited to make electrical connection between the top surface of the via 30 and along the sidewalls of pattern hole 50H. The lower conductor liner layer 60L comprise a thin film composed of a conductive material, e.g. TiN, TaN, TaTiN, TaSiN, Ta, W, or Ti, with a thickness that is small relative to the characteristic dimensions of the given technology node. For a node with characteristic via diameter of 200 nm, a liner film thickness less than 50 nm would be advantageous. Subsequent nodes with smaller characteristic dimensions would favor thinner lower conductor liner layers 60L.

Step E

Figure 7A:
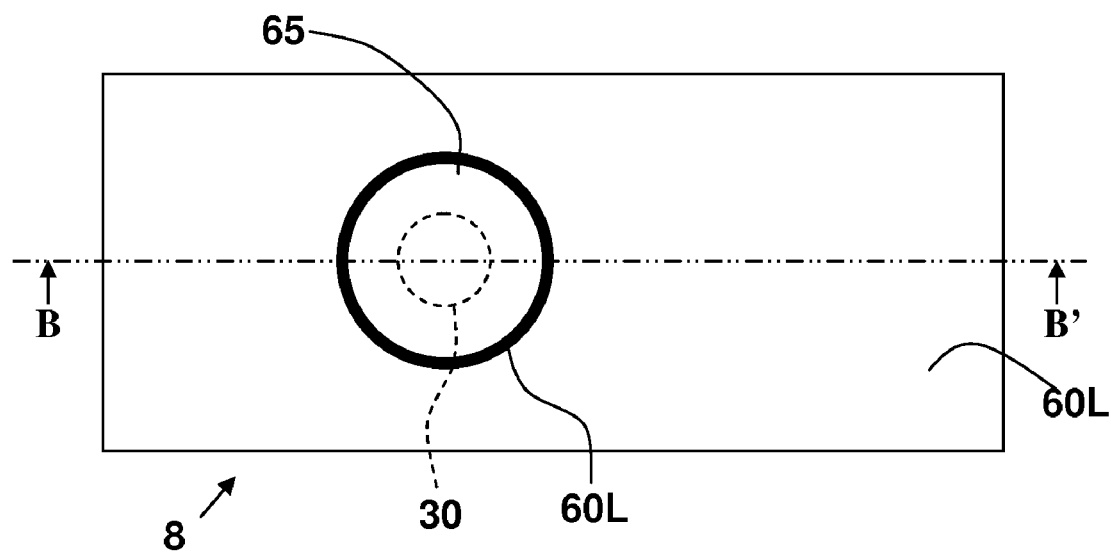

FIGS. 7A/7B show plan and cross-sectional views of the structure of FIGS. 6A/6B after deposition of a blanket second dielectric insulator layer 65 composed of a material, e.g. SiO2, SiN, BN, SiC, SiCH, or low-k material, which is deposited and planarized to the level of the top surface of lower conductor liner layer 60L. Insulator 65 may be planarized by CMP, or by a dry etching process, e.g. RIE. The excess portion of the second dielectric insulator layer 65 above the top surface of first dielectric insulator layer 40 is removed from the surface of the device 8 but remains filling the pattern hole 50H.

Step F

Figure 7B:
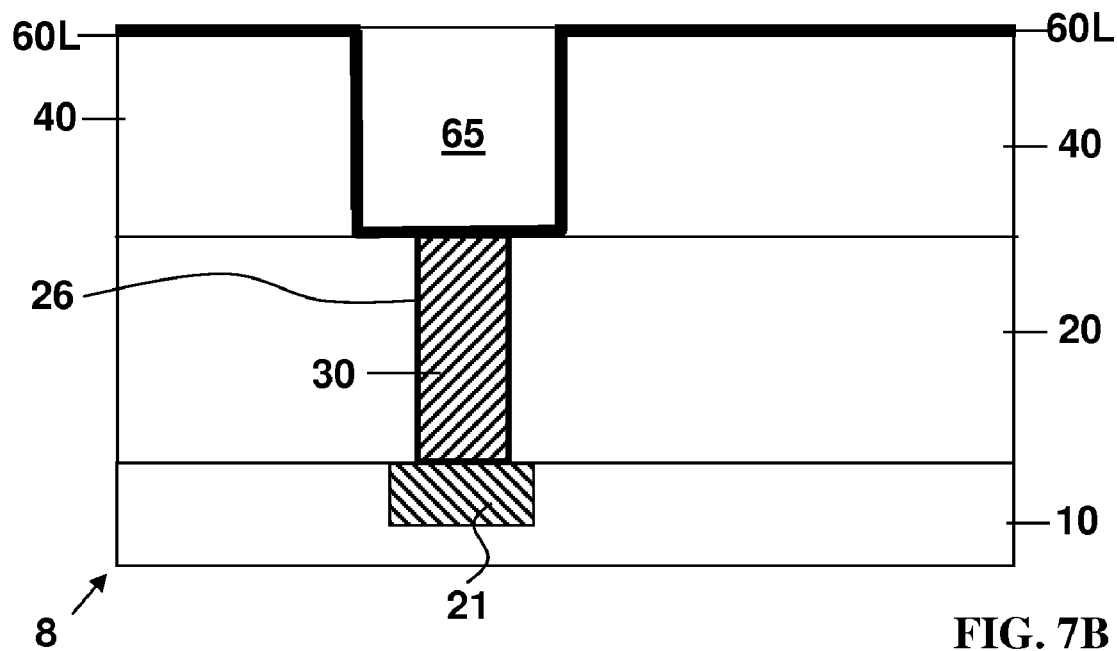
Figure 8A:
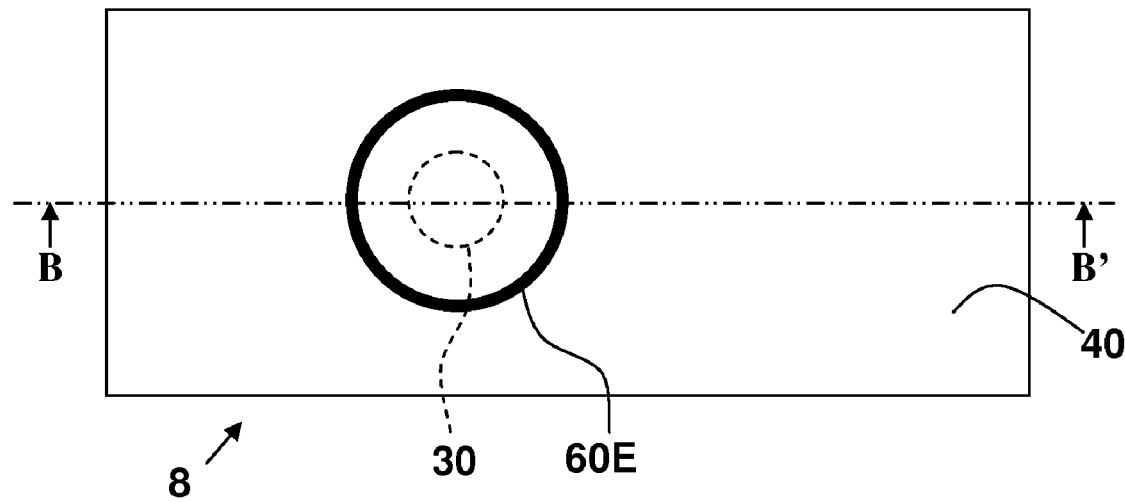
Figure 8B:
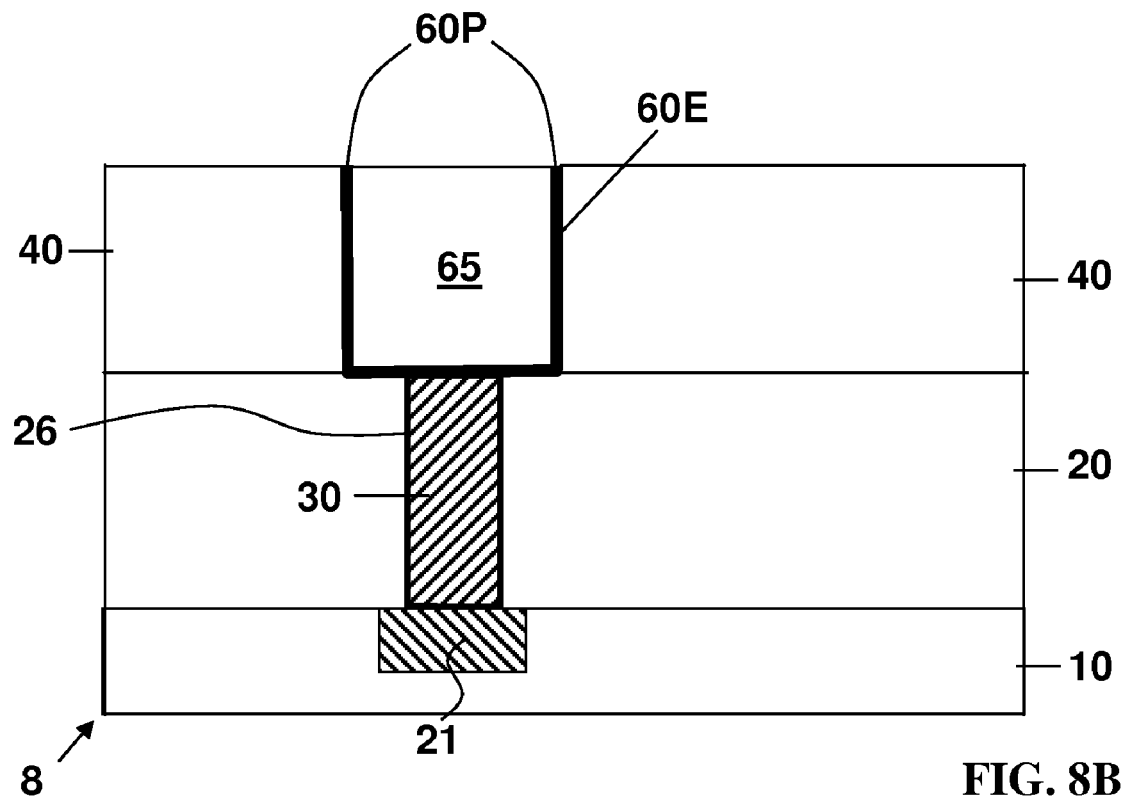
Figure 9A:
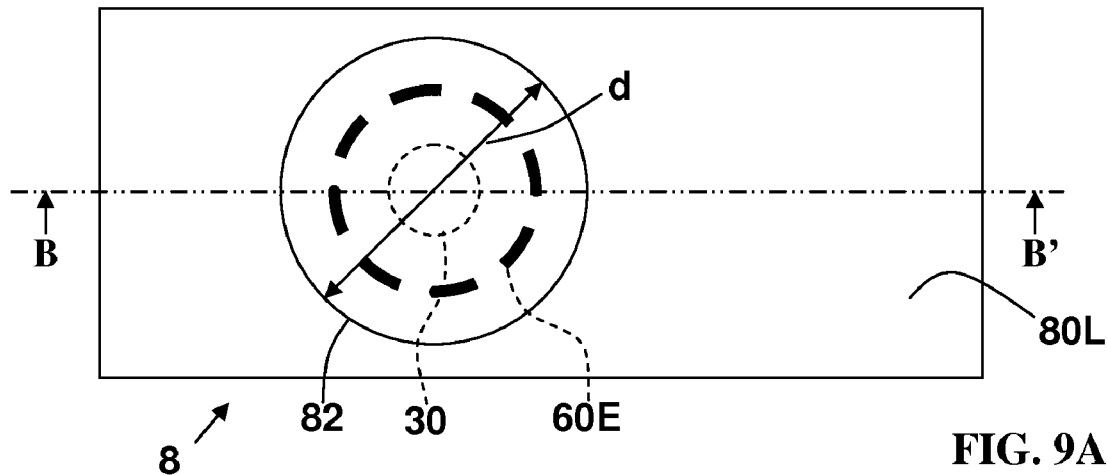
FIGS. 9A' and 9B' show plan views and FIGS. 10A' and 10B' show corresponding cross-sectional views taken along line B-B' in FIGS. 9A' and 9B' of an alternative PCM cell structure in accordance with this invention being manufactured employing an alternative process illustrated by the flow chart shown in FIG. 12.

FIGS. 8A and 8B show plan and cross-sectional views of the structure of FIGS. 7A and 7B after the top surface portion of the conductive, lower conductor, liner layer 60L above the top surface of first dielectric insulator layer 40 and aside from the periphery of the pattern hole 50H has been removed at this time by CMP, dry or wet etch, or removed in subsequent processing as explained with respect to FIGS. 9A/9B' and 10A/10B'. The remainder of the lower conductor liner layer 60L comprises the lower conductor electrode 60E. With respect to the alternative process of FIG. 12, step F is omitted and the process goes from step E to step G'. The result is that the lower electrode 60E has a flat bottom portion at the bottom of the planarized insulator 65 with cylindrical side walls assuming that the hole 50H is round extending up to the surface of the first dielectric insulator layer 40. The top peripheral edge 60P of the lower electrode 60E comprises an annulus at the top of those hollow cylindrical side walls thereof. If the hole 50H is not round then the configuration of the periphery 60P of the lower electrode 60E corresponds to the geometry of the hollow walls of the lower electrode 60E.

Step G

Figure 9B:
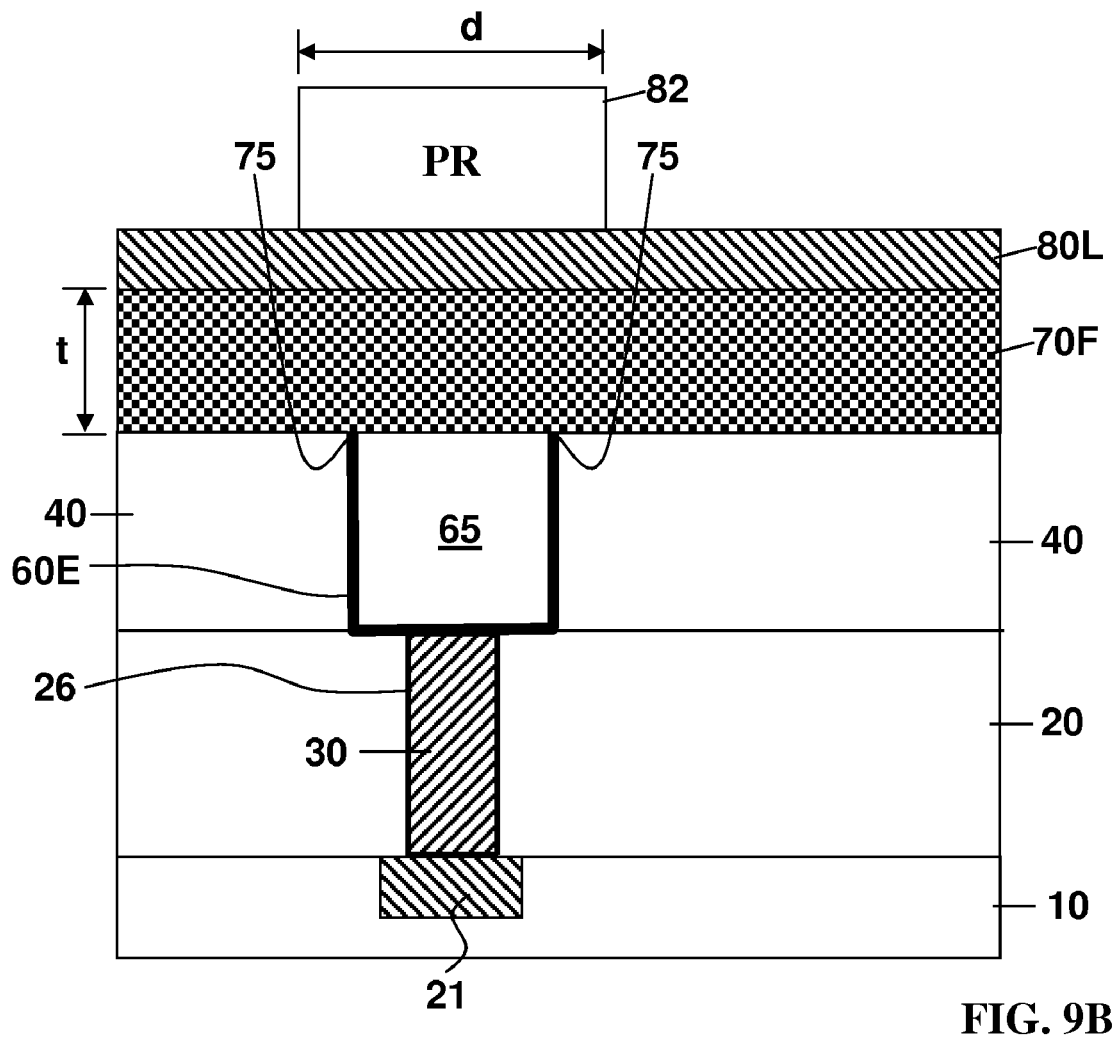
Figure 9A:
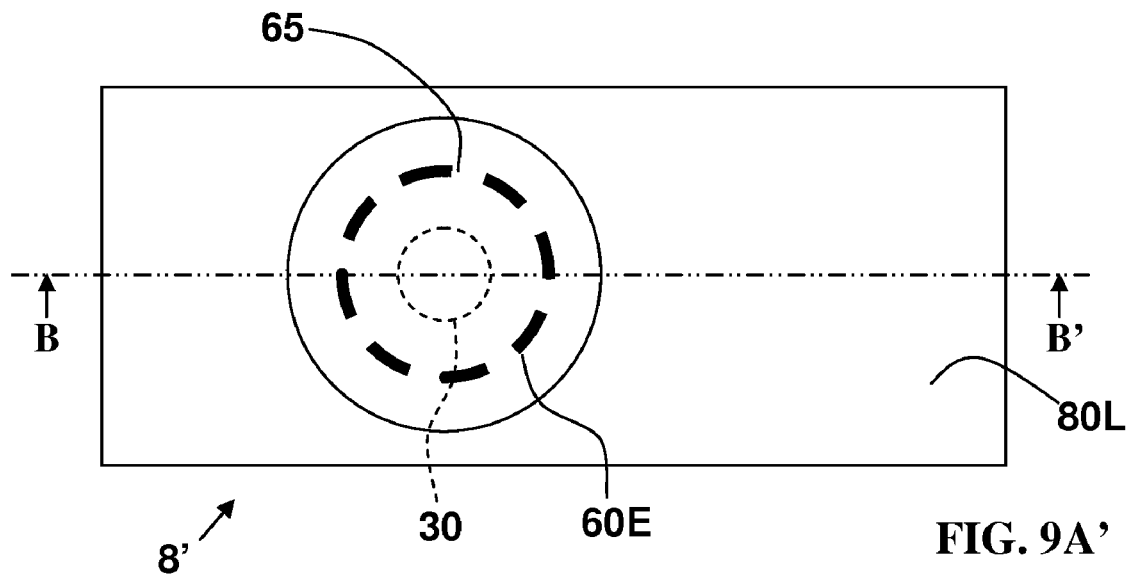
Figure 9B:
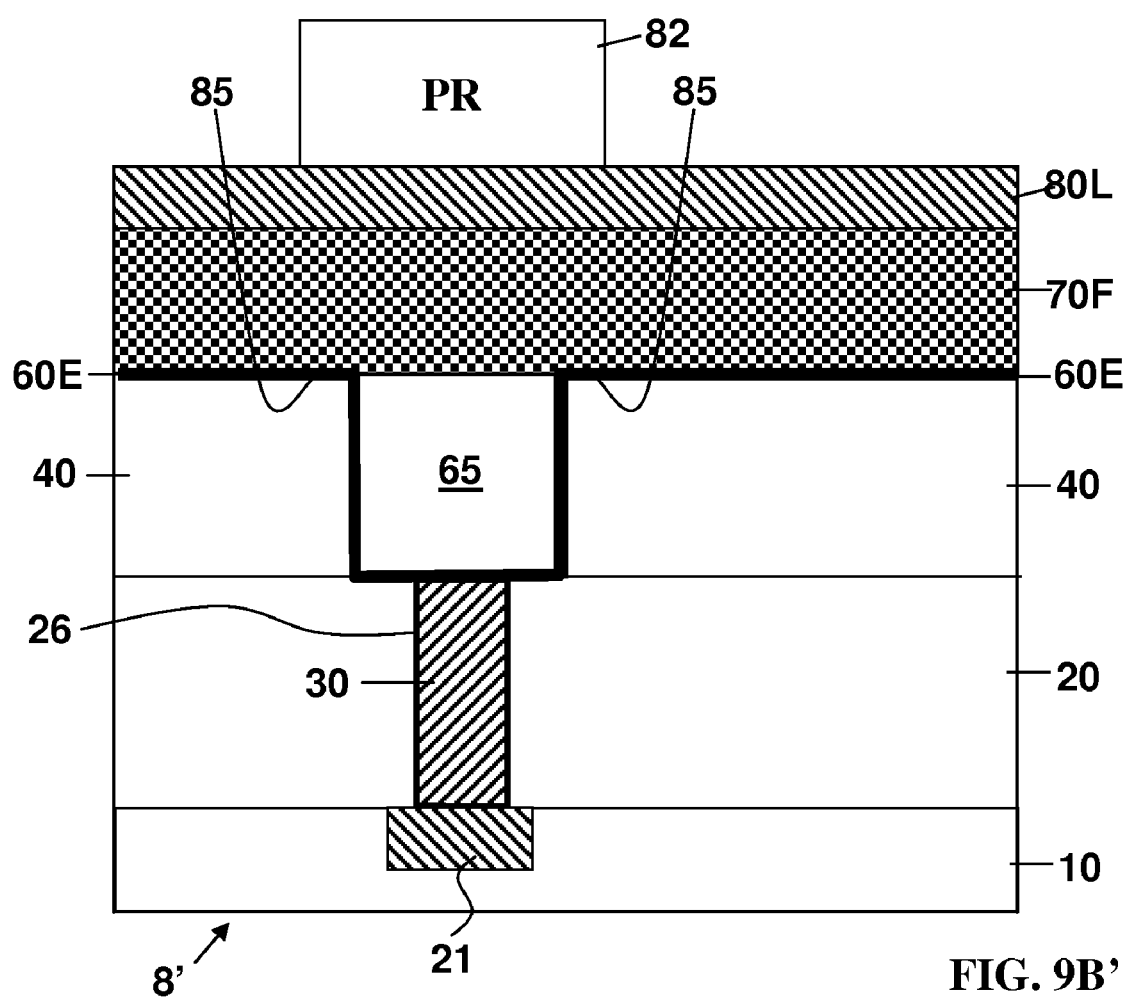

FIGS. 9A and 9B show plan and cross-sectional views of the structure of FIGS. 8A and 8B after a blanket phase change material film 70F, e.g. a combination of GeSbSnTe or the other materials discussed earlier, has been deposited which in turn has been covered with a blanket conductive upper electrode layer 80L.

Step H

FIGS. 10A and 10B show the device 8 after the, blanket phase change material film 70F and the blanket conductive upper electrode layer 80L FIGS. 9A and 9B have been patterned by a method, e.g. Reactive Ion Etching (RIE), into a PCM element 70E. As shown in FIGS. 10A and 10B, the conductive upper electrode layer 80 and the phase change material 70F have been etched in the pattern of mask 82 in FIGS. 9A/9B to form the upper electrode 80E and the PCM element 70E. The resulting structure shown in FIGS. 10A and 10B has an electrical connection 75 between the annulus of the lower conductor, liner layer 60 contained within pattern 50 and the phase change material of the PCM element 70E.

Steps G" and H"

FIGS. 9A' and 9B' show plan and cross-sectional views of the structure of FIGS. 7A and 7B in accordance with an alternative process of steps A-E and G'-H' of the flow chart shown in FIG. 12. If the top surface portion of the lower conductor liner layer 60L was not removed at this stage, i.e. before depositing the phase change material layer 70L, then removal of unwanted portions of the lower conductor liner layer 60L is deferred to step H'.

In other words, unwanted portions of the lower conductor liner layer 60L are removed concomitantly with the patterning of the film of phase change material layer 70F and the upper electrode 80 as shown in FIGS. 10A'/10B'. In this case, the resulting structure will have a thin film of liner 60L beneath the PCM element 70E and thus an electrical connection 85 is provided between liner and the phase change material in the PCM element 70E.

The liner can be advantageously used to improve readout uniformity by limiting the high-resistance excursion of the cell as it is switched to that state. For example, if the GST resistance values are 100 Ohms for the low resistance state and 1 MegOhm for the high resistance state, it may be beneficial to shunt the 1 MegOhm resistance with a 1 kOhm liner film so that readout electronics can more easily handle the difference between the two states, and so that it is easier to deliver current for heating the element to switch it back to a low resistance state. These advantages were enumerated previously in the Wicker U.S. Patent Application No. 2004/0113135.

The use of such an underlying liner film in this device can help mediate the resistance change to an opportune range of values. It can also assist with bringing the cell resistance into a manageable range for writing (e.g. without requiring high voltage drivers to pass sufficient power into an device such as a 1 MOhm device.) In addition, it can make device readout resistances more uniform. As the current will still be crowded into the thin annular liner region, sufficient local heating will take place to cause the cell to switch state even for reasonably low drive currents.

For either of the devices shown in FIGS. 10A/10B AND 10A'/10B', a further reduction in the contact area between the annular electrode and the phase change material may be accomplished by patterning the PCM element 70E and upper electrode 80 in the horizontal dimension perpendicular to the plane of the cross-sectional diagram in FIG. 10B. In this proposed embodiment, the phase change material 70 contacts only a portion of the periphery of the annular lower electrode 60E. For the specific but not limiting example of a rectangular phase change element 70E of width w straddling a round annular lower electrode 60E of diameter d and thickness t, with w chosen to be smaller than d, the resulting contact area would be on the order of $2wt$ versus $\pi dt$ for the case of a phase change element 70E fully covering the annular lower electrode 60E. Similar reductions in contact area may be achieved with other combinations of annulus and phase change element shapes, and the specific shapes should be chosen according to convenience of fabrication, performance of finished devices, or other such criteria.

An alternative embodiment for an inventive structure is shown in FIGS. 13A-18A which are plan views. FIGS. 13B-18B are corresponding sectional, elevational views taken along line B-B' in FIGS. 13A-18B of a device 108, which is an embodiment of an alternative PCM cell structure during the performance of a process for manufacture of the PCM cell structure of this invention as illustrated by FIG. 19 which is a flow chart of a process illustrated by the sequence of drawings from the FIGS. 13A and 13B to FIGS. 18A and 18B in accordance with this invention for manufacturing the PCM cell structure 108 shown in FIGS. 18A and 18B as well as the PCM cell structure 218 shown in FIGS. 21A and 21B.

Step BA

Figure 13A:
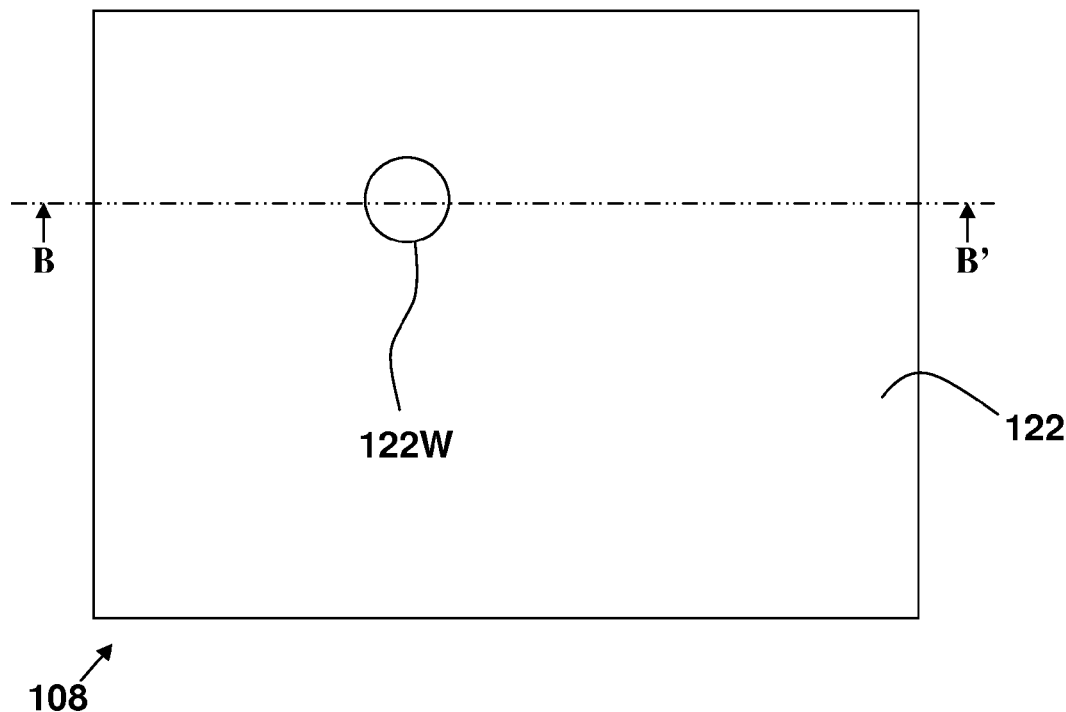
Figure 13B:
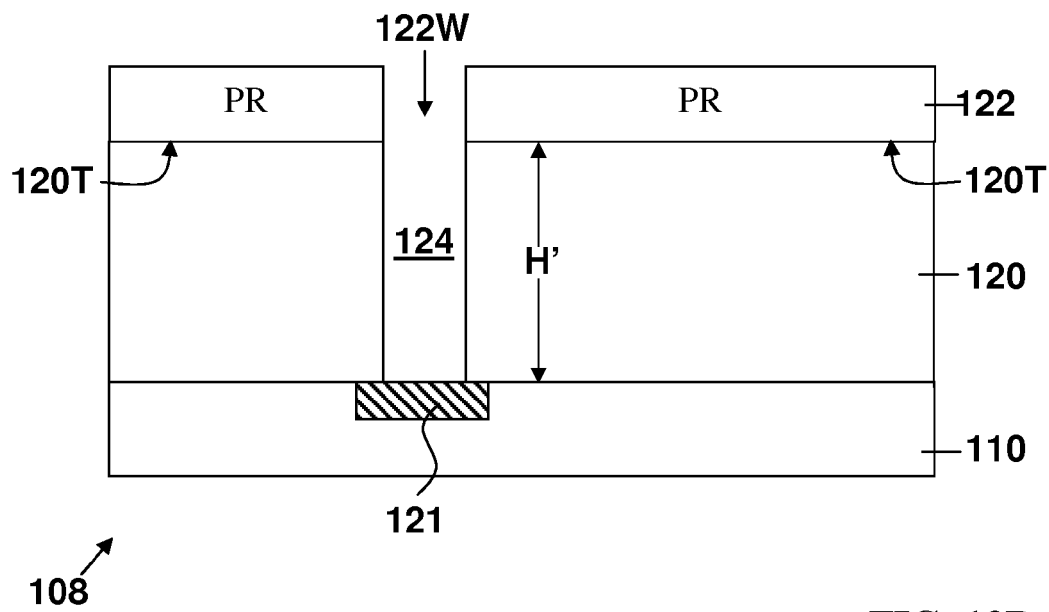
Figure 18A:
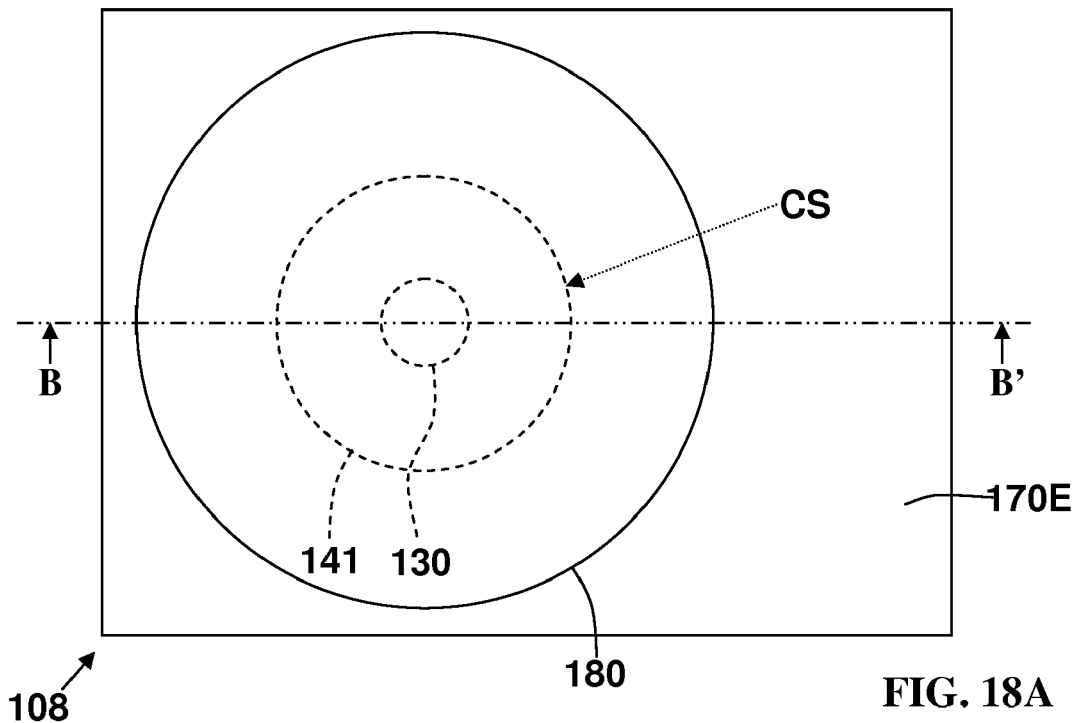
Figure 19:
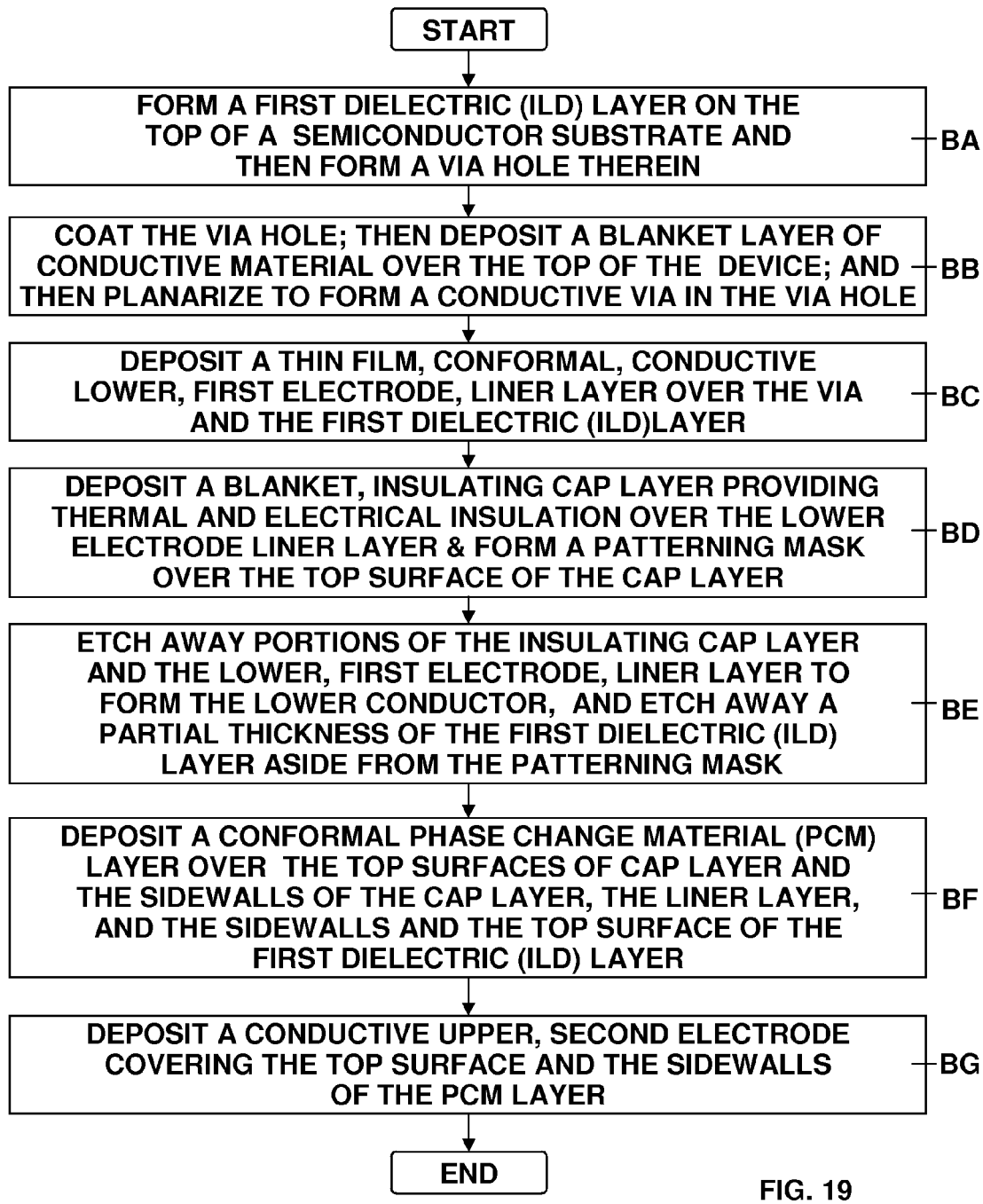
FIG. 19 is a flow chart of a process in accordance with this invention for manufacturing the PCM cell structure shown in FIGS. 18A and 18B.

FIGS. 13A and 13B show plan and sectional views of an early form of a PCM device 108 which is an alternative embodiment of the invention comprising a PCM device 108 (e.g. formed on a semi-conductor chip) in accordance with Step BA in the process of FIG. 19. The PCM device 108 shown in an initial stage of manufacture in FIGS. 13A and 13B. FIG. 13A is a plan view of the PCM device 108 after performing step BA. FIG. 13B is a sectional view taken along line B-B' in FIG. 13A. FIG. 19 is a flow chart for a process flow for producing the PCM device 108 shown in FIGS. 18A/18B.

Figure 14A:
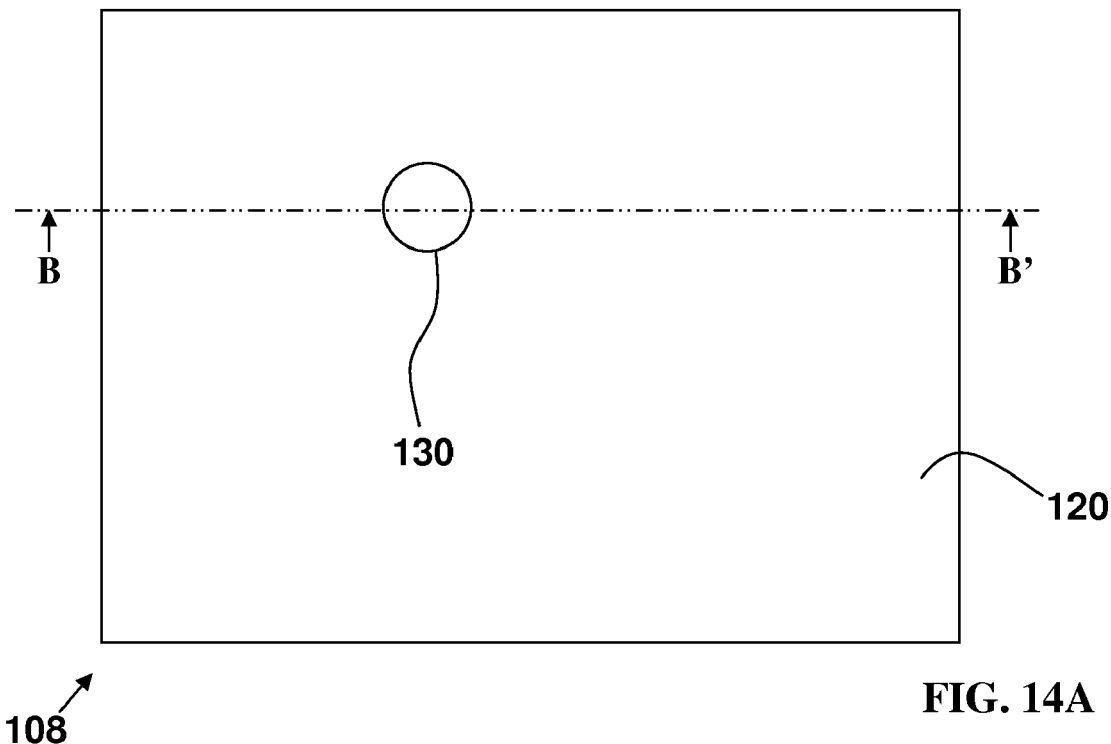
FIGS. 14A and 14B show the PCM device of FIGS. 13A and 13B respectively after performing step BB in FIG. 19.
Figure 14B:
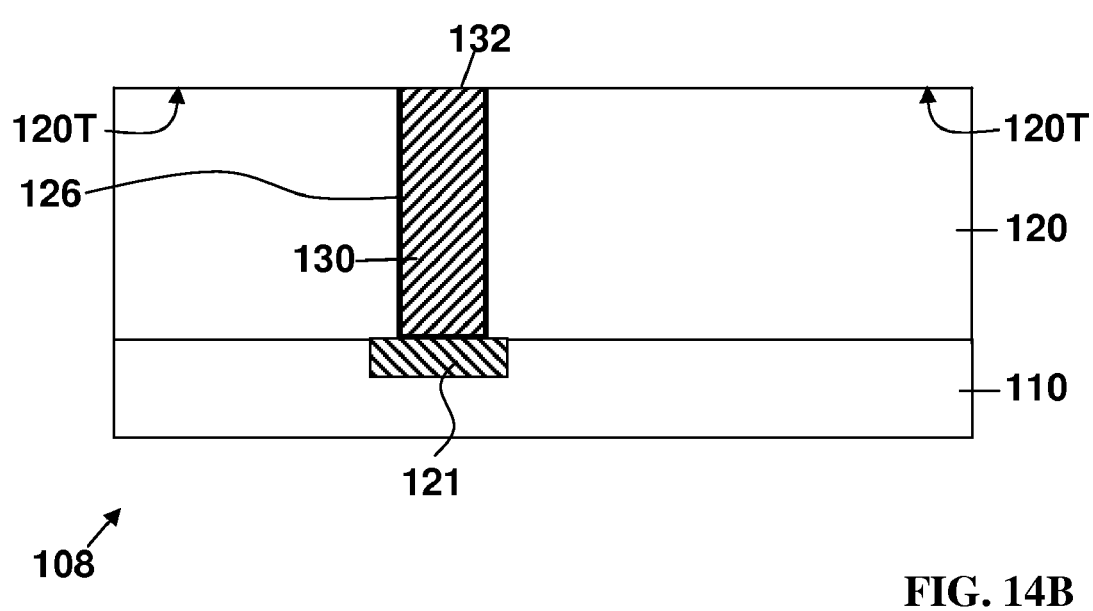

In step BA, as shown by FIGS. 13A and 13B, in a first step, form a first dielectric layer, e.g. a first dielectric InterLevel Dielectric (ILD) insulator layer 120 having a flat top surface 120T The first dielectric ILD insulator layer 120 is formed on the top surface of a substrate 110 of the PCM device 108 The first dielectric ILD insulator layer 120 is preferably thicker than layer 20 in FIGS. 3B-10B. Next, a photolithographic mask 122, e.g. photoresist (PR), with a window 122W therethrough is formed over the top surface of the ILD insulator layer 120. By etching through the window 122W, a via hole 124 is formed in the first dielectric (ILD) insulator layer 120. The via hole 124 extends to a depth H' in the first dielectric (ILD) insulator layer 120 reaching down to expose the top surface of the electrical element 121 which is below the ILD insulator layer 120 aside from the via hole 124 The via hole 124 has been formed to receive a deposit therein of conductive material to be used to form a via 130 in step BB, as shown in FIGS. 14A and 14B. The via 130 is formed to provide contact with circuitry in PCM device 108 not shown for convenience of illustration. As shown in FIG. 13B, the bottom surface 131 of the via hole 124 is coplanar with the top surface of the substrate 110. The first dielectric (ILD) insulator layer 120 comprises a material, e.g. silicon dioxide ($SiO_2$), or other low-k dielectric insulator materials. In this alternative embodiment, the height of the conductive must be selected to provide the resulting inventive structure without interfering with other interconnect or devices on the chip. The via height may be 30 nm to 2 μm, preferably 400 nm.

Step BB

FIGS. 14A and 14B show the PCM device 108 of FIGS. 13A and 13B respectively after step BB in FIG. 19. In step BB in FIG. 19, first coat the via hole 124 with a thin film 126 and then deposit a blanket layer of a conductive material 130 over the top surface 120T of the first dielectric ILD layer 120, covering the exposed surfaces of the thin film 126 as well as overfilling the via hole 124. Then planarize the PCM device 108 lowering the level of the blanket layer of the conductive material 130 leaving the top surface 120T of the first dielectric ILD insulator layer 120 exposed, forming cylindrical, conductive via 130 in the via hole 124 as described in Step BB in FIG. 19. In FIG. 14B a cross-sectional view shows PCM device 108 of FIG. 13B with the surfaces of the via hole 124 (shown in FIG. 13B) in ILD dielectric insulator layer 120 coated with a thin film 126 composed of a conventional material, e.g. titanium, after which a conductive, interconnect via 130 was formed embedded in ILD dielectric insulator layer 120 in substrate 110 by filling the via hole 124 by depositing a blanket layer of conductive material 130 over the top of device 108 and the thin film 126, thereby overfilling the via hole 124. The via hole 124, with a depth of H', is deeper than the via hole 24 in FIG. 4B. Next, the PCM device 108 is planarized leaving an interconnect, conductive via 130 inside the space defined by the thin film 126 in the via hole 124 with the top end 132 of the conductive via 130 being generally coplanar with the top surface 120T of the ILD insulator layer 120.

Steps BC and BD

Figure 15A:
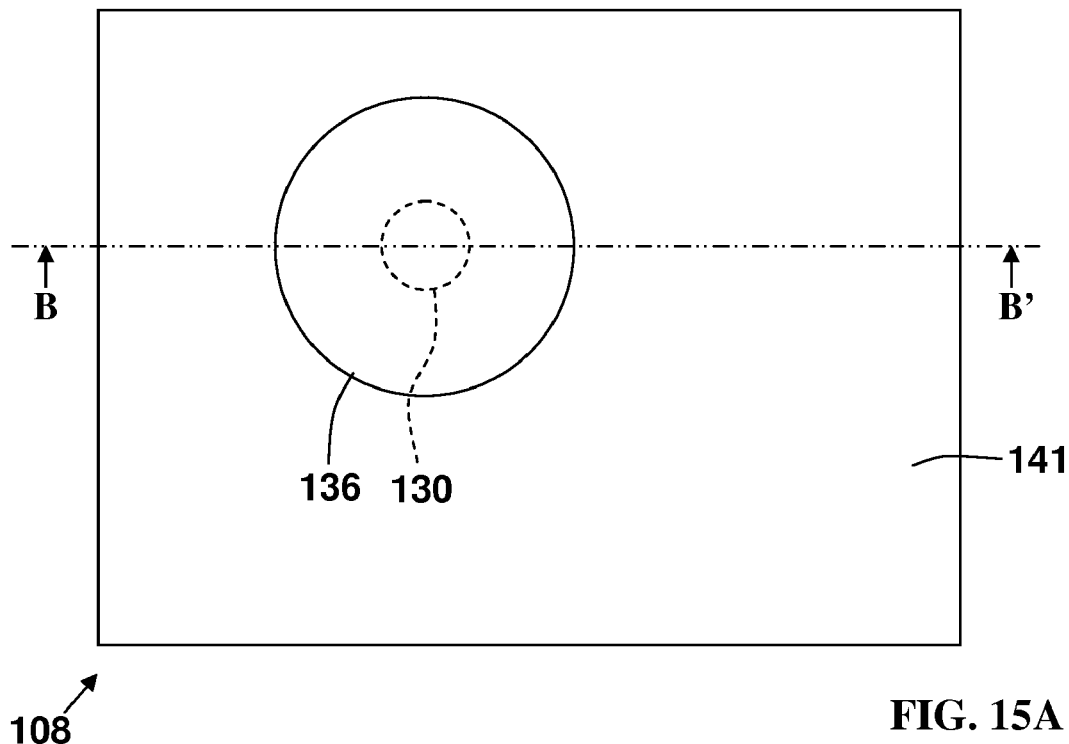
FIGS. 15A and 15B show the PCM device of FIGS. 14A and 14B respectively after performing steps BC and BD in FIG. 19.
Figure 15B:
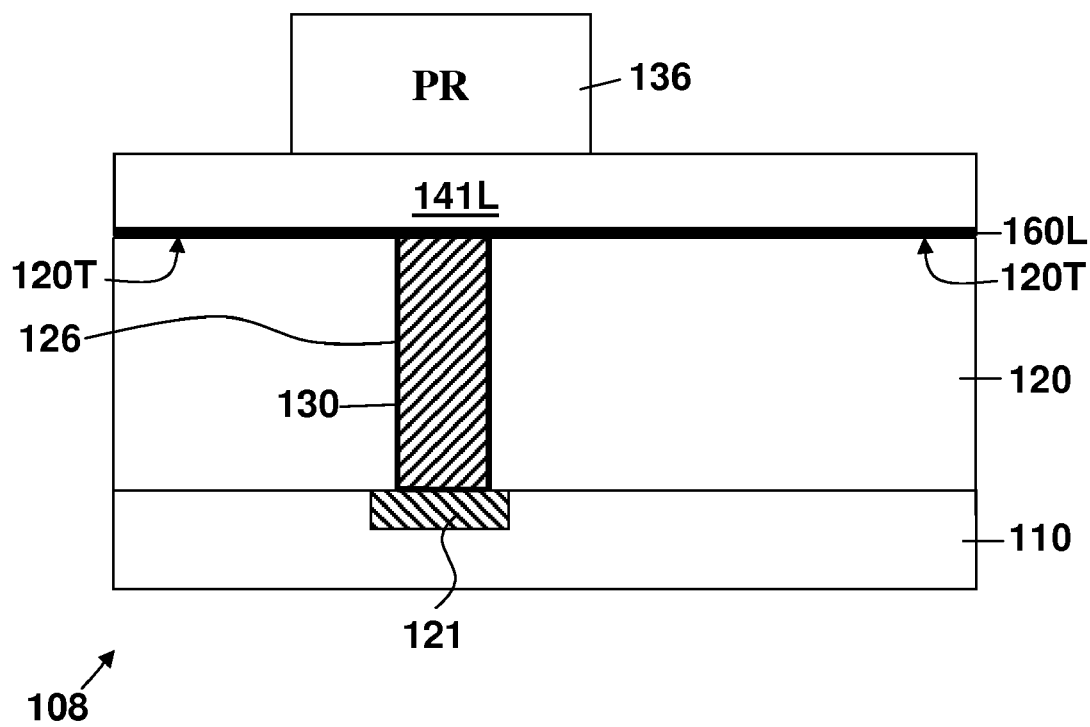

FIGS. 15A and 15B show the PCM device 108 of FIGS. 14A and 14B respectively after steps BC and BD in FIG. 19. In step BC deposit a thin, conformal, conductive, lower, first electrode, liner layer 160L over the planar top surface 120T of the first dielectric (ILD) insulator layer 120 and the planar top surface of the conductive via 130, and the top surface of the thin film 126. Then in step BD, form a blanket insulating cap layer 141L providing thermal and electrical insulation over the lower electrode, liner layer 160L. Then form a cylindrically shaped patterning mask 136 over the top surface of the blanket insulating cap layer 141L as shown in FIGS. 15A and 15B. FIG. 15B shows the thin film 126; a planar, conductive, lower electrode, liner layer 160L, of a thickness from about 10 nm to about 200 nm; and an insulating mask cap layer 141L, e.g. from about 10 nm to about 500 nm SiN, SiCN, or $SiO_X$, are deposited. Then form a cylindrical mask 136 over the top surface of the insulating cap layer 141L located over the top end 132 (shown in FIG. 14B) of the conductive via 130 in the first dielectric ILD insulator layer 120. The lower electrode, liner layer 160L covers the top surface of the conductive via 130 and need not be centered thereover. The lower conductor liner layer 160L comprises a thin film composed of a conductive material, e.g. TiN, TaN, TaTiN, TaSiN, Ta, W, or Ti, with a thickness that is small relative to the characteristic dimensions of the given technology node. For a node with characteristic via diameter of 200 nm, a thickness of the liner film 160L less than 50 nm would be advantageous. Subsequent nodes with smaller characteristic dimensions would favor correspondingly thinner liner layers 160L.

Step BE

Figure 16A:
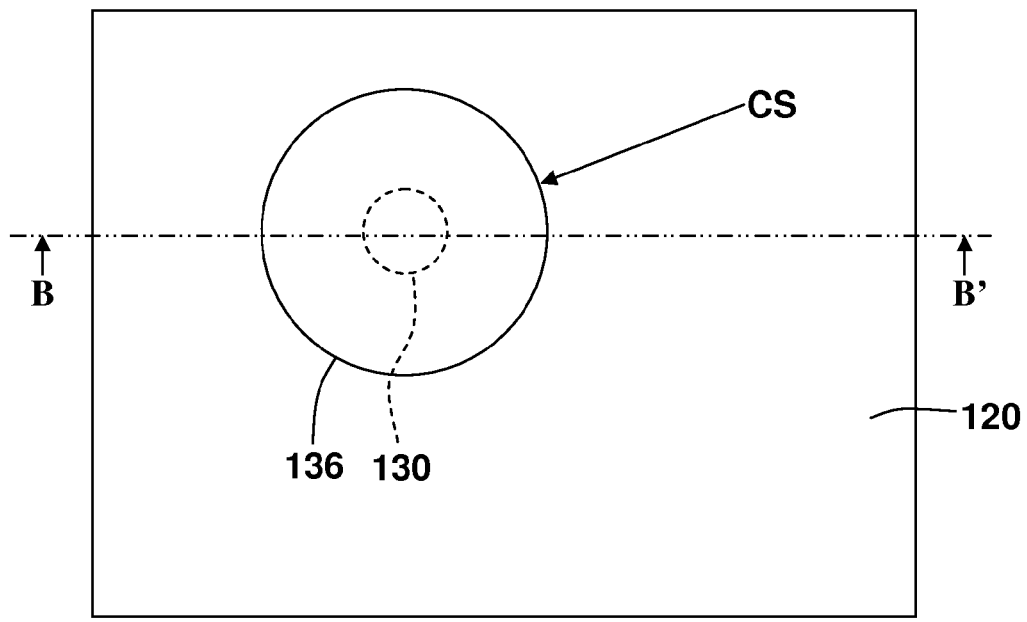
FIGS. 16A and 16B show the device of FIGS. 15A and 15B respectively after performing step BE in FIG. 19.
Figure 16B:
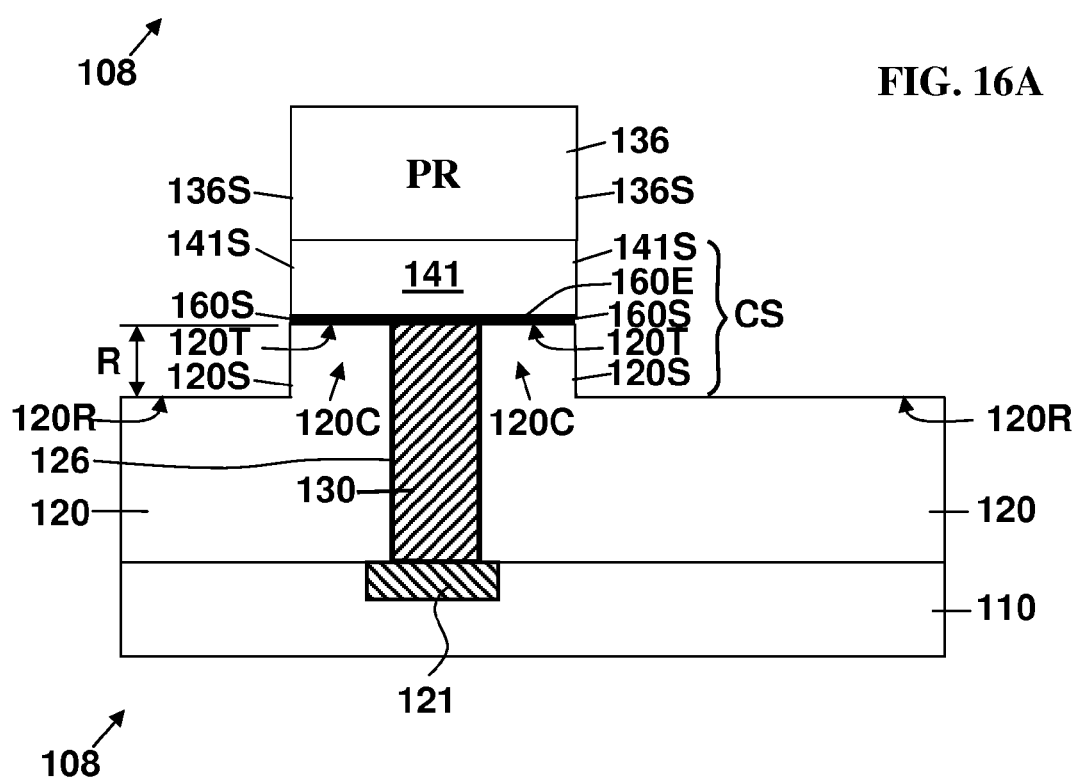

FIGS. 16A and 16B show the PCM device 108 of FIGS. 15A and 15B respectively after step BE in FIG. 19 of etching in the pattern of the cylindrical patterning mask 136 forming a three level cylindrical stack CS from the layers. FIG. 16A is a plan view showing a cylindrical photoresist mask 136 formed above the ILD insulator layer 120 with the via 130 (in phantom) below the mask. FIG. 16B is an elevation of the PCM device 108 with the ILD insulator layer 120 etched back aside from the three level cylindrical stack CS to a recessed surface 120R aside from of the three level cylindrical stack CS. The three level cylindrical stack CS includes the elevated central portion 120C of the first ILD insulator layer 120 with the first electrode 160E thereabove and with the insulating cap 141 on top of the first electrode 160E. The elevated central portion 120C, the first electrode 160E and the insulating cap 141 have vertical, aligned sidewalls on the circumference thereof. The aligned sidewalls include top vertical sidewalls 141S of the insulating cap 141 formed from the insulating cap layer 141L, a first electrode 160E with middle vertical sidewalls 160S formed P from the lower electrode, liner layer 160L of FIG. 15B, and an upper insulator region 120C with base vertical sidewalls 120S formed from the first ILD insulator layer 120. The upper insulator region 120C is a cylindrical region formed from the top portion of the first ILD insulator layer 120 below the top surface 120T thereof. Top vertical sidewalls 141S, the middle vertical sidewalls 160S, and base vertical sidewalls 120S are all oriented at a vertical angle and aligned with each other. Thus, step BE forms a disk shaped cylindrical insulating cap 141; a disk shaped, lower, first electrode 160E; and a disk shaped upper insulator region 120C by etching away a partial thickness "R" of the first dielectric (ILD) insulator layer 120. In sectional view FIG. 16B the planar, conductive, lower electrode 160E is shown formed from liner layer 160L, insulating cap 141 formed from cap layer 141L, and upper insulator region 120C formed from the top portion of the ILD dielectric, insulator layer 120, which features are patterned using photolithography with a mask 136 and anisotropic dry etch forming a cylindrical patterned stack. The top vertical sidewalls formed by the cap 141 were formed from cap layer 141L. The middle vertical sidewalls 160S of the disk-shaped lower, first electrode 160E were formed from the lower electrode, liner layer 160L. The base vertical sidewalls 120S were formed on the upper insulator region 120C of the ILD insulator layer 120. The planar disk-shaped, lower, first electrode 160E is formed from the lower electrode, liner layer 160L with exposed edges on the periphery thereof comprising the second vertical sidewalls 160S. The portion of the first dielectric (ILD) insulator layer 120 aside from the mask 136 is recessed to a depth R below the original top surface of the first dielectric (ILD) insulator layer 120 leaving a cylindrical portion thereof beneath the cylindrical insulating cap 141 and the first electrode 160E. A region of the ILD dielectric, insulator layer 120 remains masked by lower first electrode 160E, planar, liner disk 160L and cylindrical insulating cap 141. The depth "R" of the etch into the first dielectric (ILD) insulator layer 120 masked by cylindrical, insulating cap 141 may be from about 0 nm to about 2 μm, preferably 50 nm. As can be seen in FIG. 16B, the lower, first electrode 160E, the cylindrical, insulating cap 141, and the mask 136 have matching, substantially vertical sidewalls extending down below the top surface of the first dielectric (ILD) layer 120 by the depth "R" with the top surface of the first dielectric (ILD) layer 120 aside from the disk-shaped patterned stack.

Step BF

Figure 17A:
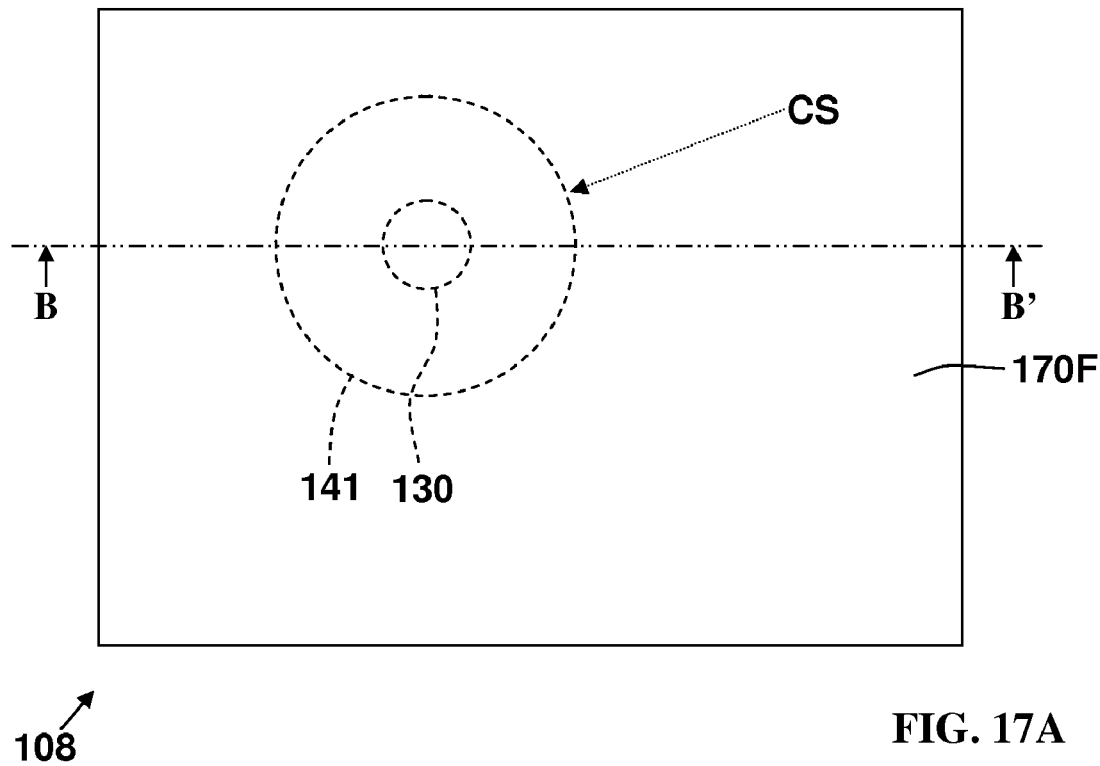
FIGS. 17A and 17B show the PCM device of FIGS. 16A and 16B after performing step BF in FIG. 19.
Figure 17B:
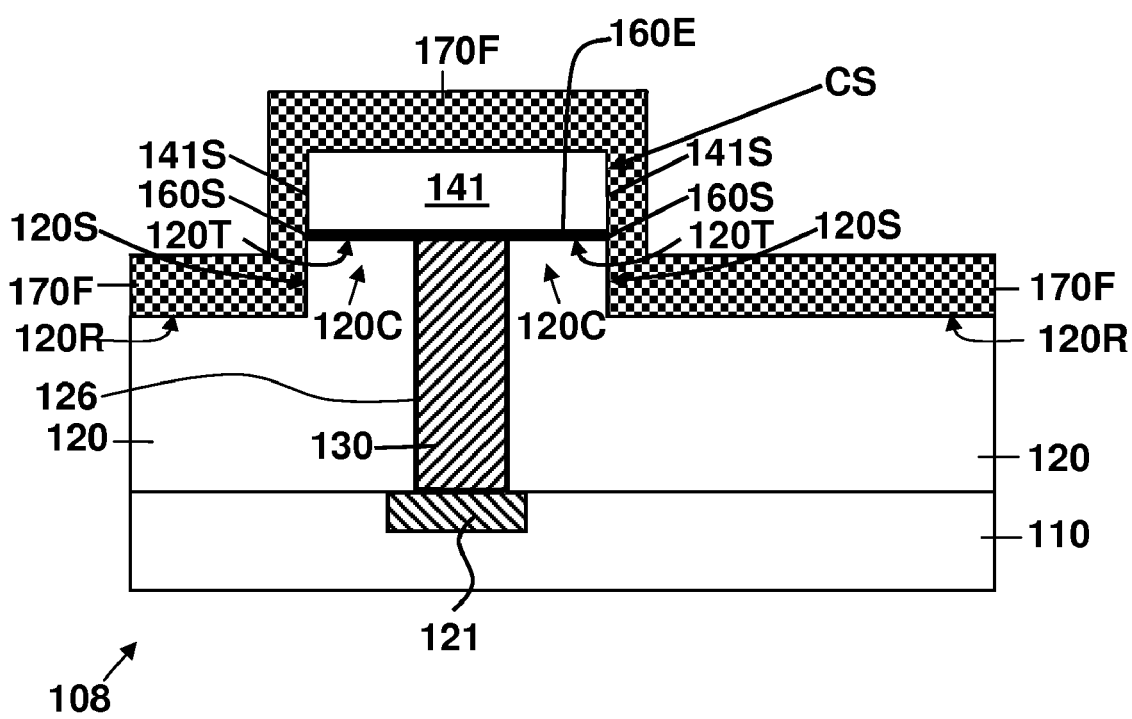

FIGS. 17A/17B show the PCM device 108 of FIGS. 16A/16B after step BF in FIG. 19 wherein a partially cylindrical, conformal PCM film 170F was deposited covering the top surfaces and surrounding the top vertical sidewalls 141S of the cylindrical cap layer 141, the peripheral contact sidewalls 160S of the first electrode 160E, and the base vertical sidewalls 120S of the upper insulator region 120C. As shown by the drawings, a cylindrical portion of the conformal, PCM film 170F covers the top surface and covers and surrounds top vertical sidewalls 141S of the cylindrical cap layer 141, covers and surrounds the middle vertical sidewalls 160S of the first electrode 160E and covers and surrounds the vertical sidewalls 120S of the upper insulator region 120C of the first dielectric, ILD insulator layer 120. In FIGS. 17A and 17B the mask 136 was stripped from the PCM device 108. Subsequently a blanket, conformal Phase Change Material (PCM) film 170F has been deposited to cover the top surface including the vertical sidewalls of the cylindrical, insulating cap 141 and the recessed first dielectric ILD insulator layer 120 and the vertical sidewalls 160S on the edges, i.e. the periphery, of the disk shaped lower, first electrode 160E structure formed in FIG. 16B. The exposed third, vertical sidewalls (surfaces) 160S on the periphery of the conductive, disk-shaped lower, first electrode 160E are in direct contact with the PCM film 170F.

At the point in the process shown in FIG. 17B, the top surface of the lower, first electrode 160E is electrically insulated by the insulating cap 141 from the portion of the lower surface of the Phase Change Material (PCM) film 170F, located directly above the insulating cap 141. The phase change material film 170F may be protected by a cap of material, e.g. TiN, to enable it to be coarsely patterned so that it is roughly centered on the stud, i.e. conductive via 130, including the insulating cap 141 and electrical element 121 beneath it. Depending on the protective material of the insulating cap 141 material, this can be done in a self-aligned fashion using standard deposition techniques which deposit thicker on raised surfaces, followed by a blanket "spacer" etch.

Step BG

Figure 18B:
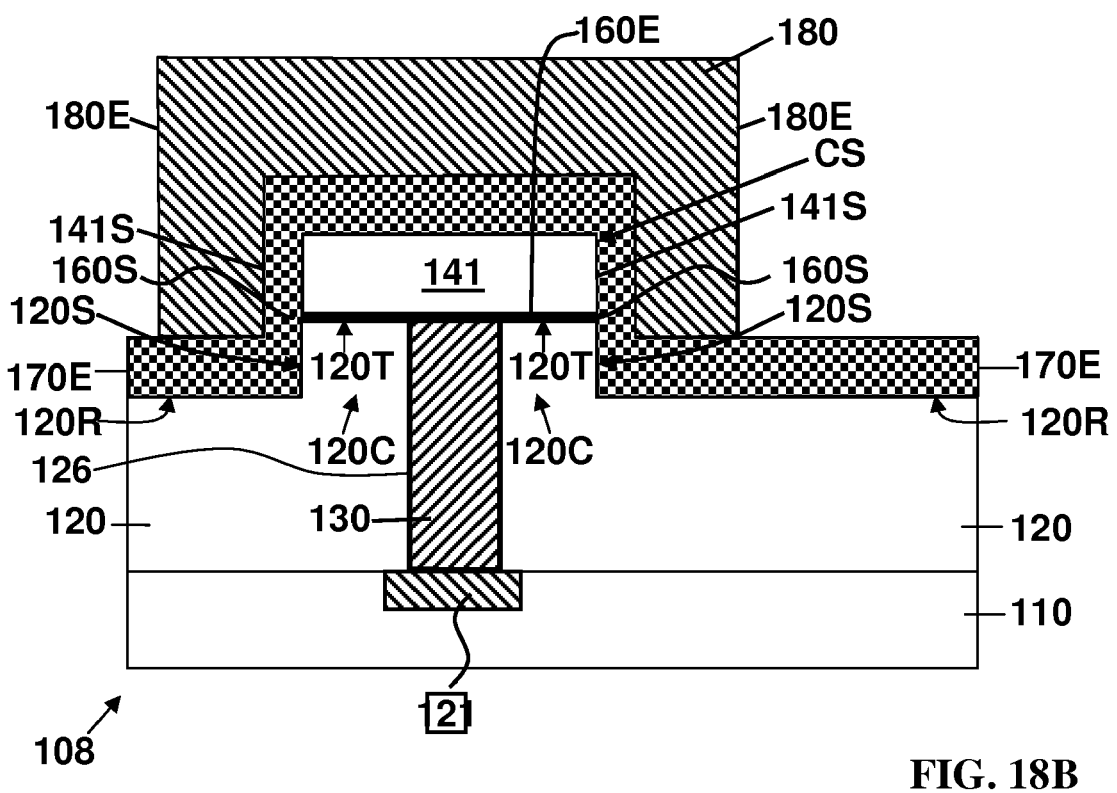

FIGS. 18A and 18B show a PCM cell structure 108. FIG. 18A is a plan view of the PCM cell structure 108 with the solid cylindrical upper electrode 180 surrounding the cylindrical cap layer 141 (in phantom) and the cylindrical first dielectric ILD insulator layer 120 with the lower conductor 160E with its round disc shaped planar configuration. FIG. 18B shows the result of forming a solid cylindrical upper electrode 180E by deposition, photolithography, and etching. Alternatively, if the phase-change material element 170E has not been patterned earlier in Step BF, it can be patterned in the same step as the patterning of electrode 180E. In another alternative embodiment shown in FIG. 21A, the phase-change material element 170E is generally of rectangular or as a further alternative may be of an indeterminate configuration in that it is shown as being coextensive with the substrate 110. Phase-change material film 170F of FIG. 17A/17B now comprises as a phase-change element 170E below the upper electrode 180E. The periphery 160S of the planar exposed conductive, lower electrode, liner layer 160E is in contact with the inner sidewalls of the vertical surface of the phase-change material element 170E. The peripheral contact extends around the entire circumference of disc shaped, conductive, lower electrode 160E.

Electrode 180E can be a jumper (W, TiN, Ta, TaN) to connect between the PCM element 170E and a nearby high-current wire. Alternatively, electrode 180E can be the high-current wire itself (e.g. Damascene copper.) The latter option is enabled by previous patterning of the phase change material.

As in the case of the first embodiment described earlier, this alternative embodiment shown in FIGS. 18A and 18B also supports further reduction of contact area via patterning of the PCM element 170E and upper electrode 180E in the other horizontal dimension.

Figure 20A:
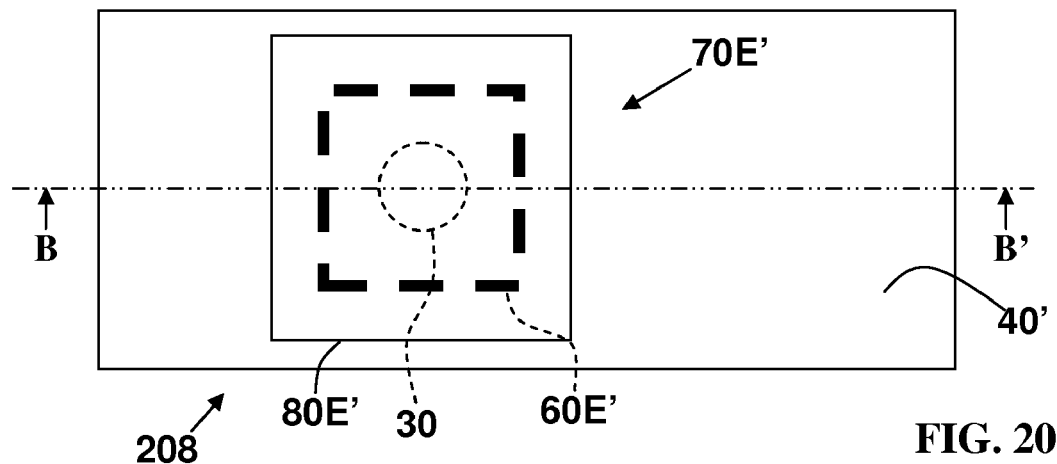
FIG. 20A shows a plan view and FIG. 20B shows a corresponding sectional, elevational view taken along line B-B' in FIG. 20A of a PCM cell structure based on the device of FIGS. 10A/10B which has been modified into a square configuration.
Figure 20B:
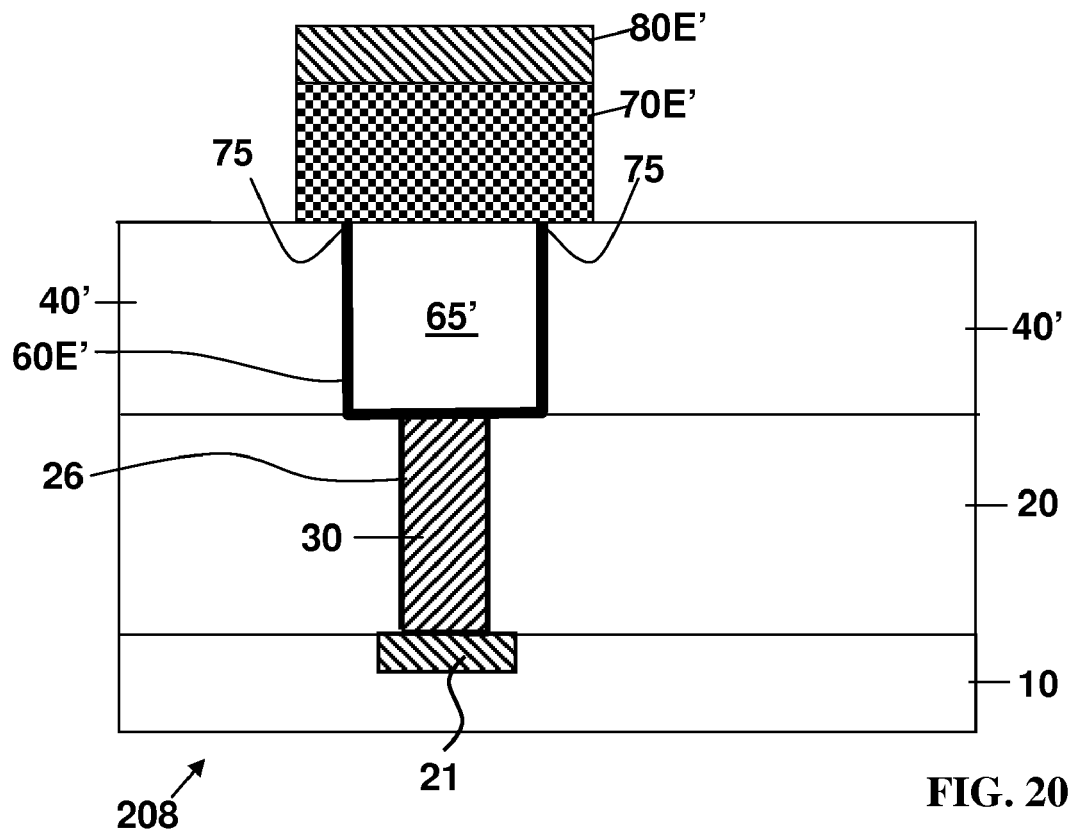

FIG. 20A shows a plan view and FIG. 20B shows a corresponding sectional, elevational view taken along line B-B' in FIG. 20A of a device 208 with a PCM cell 70E' based on the PCM cell structure of FIGS. 10A/10B. Device 208 has been modified into a square configuration. The lower conductor electrode 60E' is of a hollow square configuration as seen in the plan view of FIG. 20A instead of a hollow, annular configuration as in FIG. 10A. The PCM element 70E' and the upper electrode 80E' have square configurations in the plan view of FIG. 20A. This modification is indicative of the fact that the configurations of the devices may have many different geometric shapes exemplified by the two examples which FIGS. 10A and 20A illustrate.

Figure 21A:
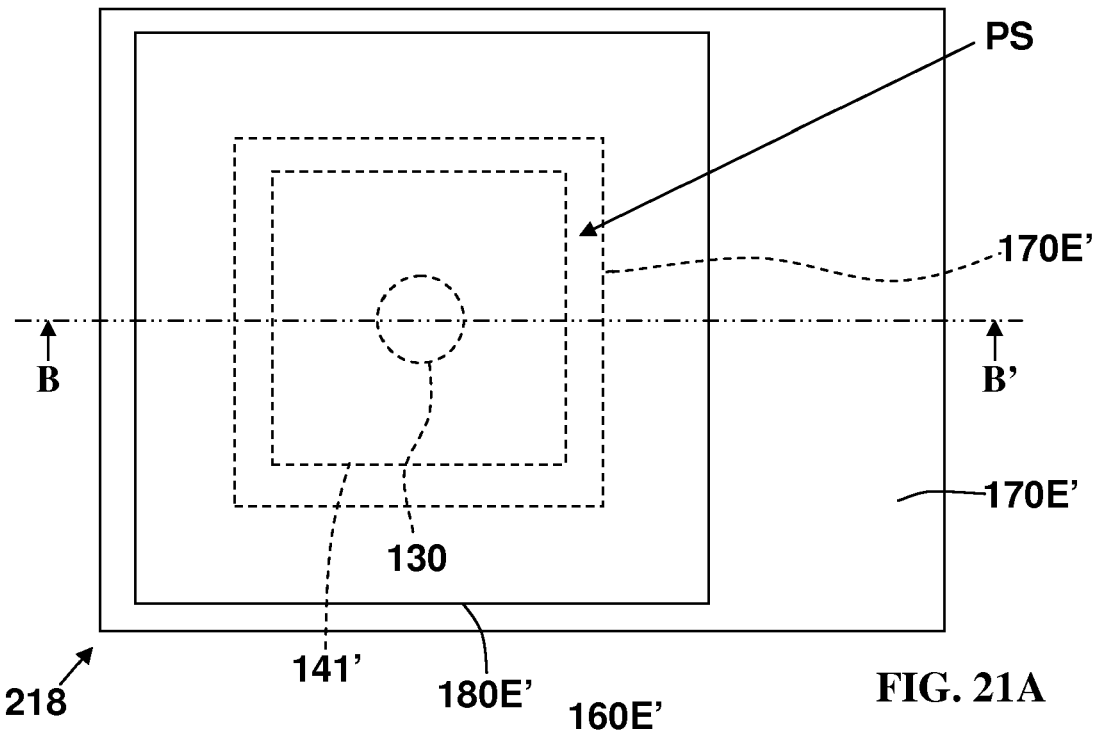
FIG. 21A shows a plan view and FIG. 21B shows a corresponding sectional, elevational view taken along line B-B' in FIG. 21A of a PCM cell structure based on the device of FIGS. 18A/18B modified into a square configuration.
Figure 21B:
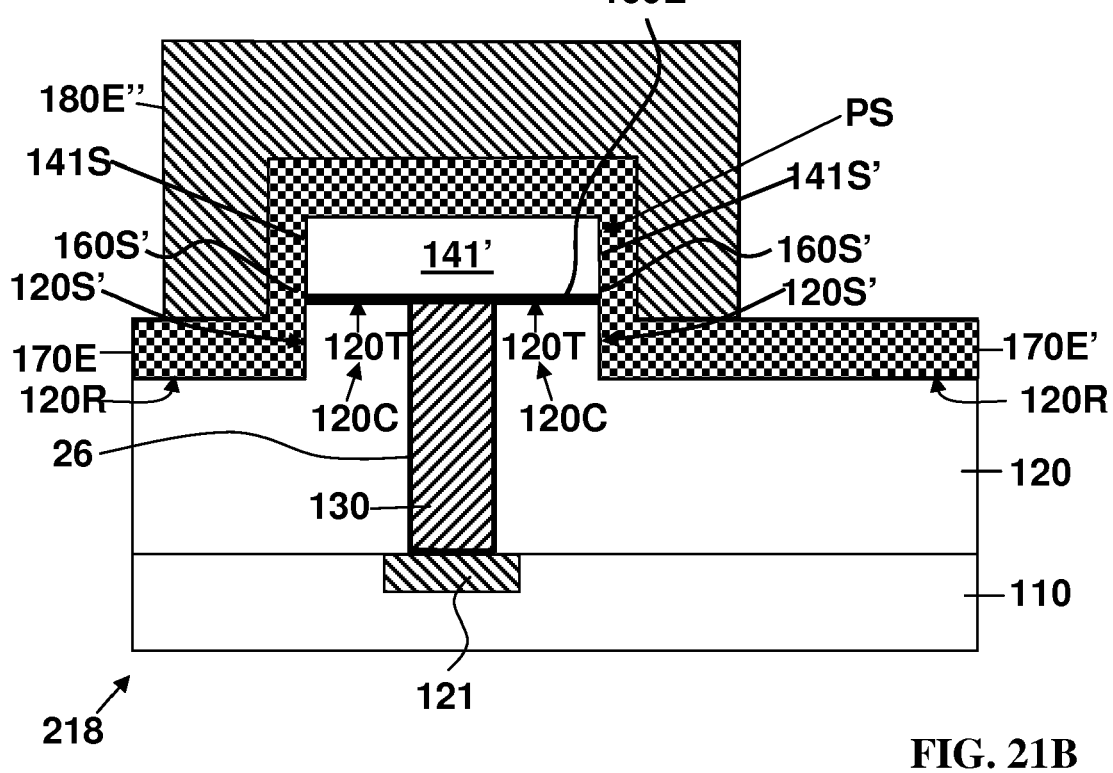

FIG. 21A and FIG. 21B show a PCM cell structure 218 based on the device 108 of FIGS. 18A/18B which has been modified into the patterned stack PS with cubic shape which is shown in a plan view in FIG. 18B with a square configuration of a patterned trilayer stack PS. FIG. 21A shows a plan view of the PCM cell structure 218 and FIG. 21B shows a corresponding sectional, elevational view thereof taken along line B-B' in FIG. 21A of the PCM cell structure 218 with the same peripheral contact of a planar lower conductor 160E' with a PCM element 170E' structure based on the PCM cell structure of FIGS. 18A/18B except that instead of a cylindrical patterned stack CS that it is shown in FIGS. 21A/21B as a patterned stack PS with a square corner configuration as seen previously herein in the plan view of FIG. 20A. The square corner lower conductor 160S' is a planar square instead of a round disc shaped planar configuration as in FIG. 18A. In the embodiment of FIG. 18A, the square corner insulating cap 141 has a square configuration, and the upper region 120C is a square block formed from the top surface of the first dielectric (ILD) insulator layer 120. The square corner PCM element 170E' has a rectangular configuration and upper electrode 180E" has a square configuration in the plan view of FIG. 20A. This modification of shapes in the plan view of FIG. 21A is indicative of the fact that the configurations of the patterned stack of such devices may have many different geometric shapes as is exemplified by the two examples which FIGS. 18A and 21A illustrate, but while maintaining the peripheral contact between the periphery of the lower electrodes 160 and 160' with the PCM cell structures 170E and 170E' respectively. In this case, as with FIGS. 8A/18B the PCM element 170E' covers and surrounds the periphery of the planar lower conductor 160'.

The foregoing description discloses only exemplary embodiments of the invention. Modifications of the above disclosed apparatus and methods which fall within the scope of the invention will be readily apparent to those of ordinary skill in the art. While this invention has been described in terms of the above specific exemplary embodiment(s), those skilled in the art will recognize that the invention can be practiced with modifications within the spirit and scope of the appended claims, i.e. changes can be made in form and detail, without departing from the spirit and scope of the invention. Accordingly, while the present invention has been disclosed in connection with exemplary embodiments thereof, it should be understood that changes can be made to provide other embodiments which may fall within the spirit and scope of the invention and all such changes come within the purview of the present invention and the invention encompasses the subject matter defined by the following claims.

What is claimed is:

1. A phase change memory cell comprising:
    a first dielectric layer having an upper region with a central upper surface which is flat and a recessed region of said first dielectric layer surrounding said upper region, with said recessed region having a recessed surface lower than said central upper surface;
    said first dielectric layer including a via conductor extending therethrough having an upper surface coplanar with said central upper surface;
    a trilayer stack including said upper region of said first dielectric layer, a lower electrode which is a planar, flat, thin film formed on said central upper surface, and an insulating cap of dielectric material formed on said lower electrode;
    said upper region, said lower electrode and said insulating cap having aligned vertical sidewalls extending from a top surface of said insulating cap down to said recessed surface of said recessed region surrounding said trilayer stack;
    said recessed region extending aside from said trilayer stack and said upper region, aside from said via conductor and aside from said central upper surface;
    said lower electrode is in contact with a top surface of said via conductor, said lower electrode layer having a periphery;
    a phase change element formed on said upper surface of said insulating cap on said aligned vertical sidewalls and on said lower recessed surface with said periphery of said lower electrode contacting said phase change element at an angle to an inner surface thereof surrounding said vertical sidewalls of said trilayer stack; and
    an upper electrode formed over and in electrical contact with said phase change element;
    wherein said phase change element is electrically connected to at least a portion of said periphery of said lower electrode.

2. The phase change memory cell structure of claim 1, wherein said lower electrode is disk shaped.

3. The phase change memory cell structure of claim 1, wherein:
    said lower electrode is disk shaped and is disposed at an angle with respect to an inner surface of said phase change element; and
    said lower electrode includes a portion oriented so that its contact with the phase change element provides a conductive shunting path.

4. The phase change memory cell of claim 1 wherein:
    said stack, including upper region of said first dielectric element is cylindrical;
    said thin film lower electrode is disk shaped;
    said cap layer is cylindrical; and
    said phase change element is conformal with said insulating cap.

5. The phase change memory cell of claim 1 wherein:
    said upper region of said first dielectric element is cylindrical;
    said lower electrode is disk shaped;
    said cap layer is cylindrical; and
    said phase change element is conformal with said insulating cap and includes a cylindrical portion covering top and sidewall surfaces of said insulating cap.

6. The phase change memory cell of claim 1 wherein:
    said first dielectric element has square corners;
    said lower electrode has square corners;
    said insulating cap has square corners; and
    said phase change element has square corners and is conformal with said insulating cap.

7. The phase change memory cell of claim 1 wherein:
    said first dielectric element is cylindrical;
    said lower electrode is disk shaped;
    said insulating cap is cylindrical; and
    said phase change element is conformal with said insulating cap and includes a cylindrical portion covering top and sidewall surfaces of said insulating cap.

8. The phase change memory cell structure of claim 1, wherein said phase change element is electrically connected to said periphery of said lower electrode.

9. The phase change memory cell structure of claim wherein said lower electrode is oriented so that its contact with said phase change element provides a conductive shunting path.

10. A phase change memory cell, comprising:
    a first dielectric layer having an upper region with a central upper surface which is flat and a recessed region of said first dielectric layer surrounding said upper region, with said recessed region having a recessed surface lower than said central upper surface;
    a trilayer stack including said upper region of said first dielectric layer, a first electrode comprising a planar, flat, thin film formed on said central upper surface, and an insulating cap of dielectric material on said first electrode with said trilayer stack being surrounded by vertical sidewalls;
    a phase change element;
    said first electrode having a periphery;
    a second electrode;
    said phase change element being located between said first electrode and said second electrode having an inner surface and a separate surface;
    said phase change element surrounding said vertical sidewalls of said trilayer stack; and
    said first electrode having said periphery of said first electrode in electrical and mechanical contact with said inner surface of said phase change element at a normal angle to said inner surface and said separate surface of said phase change element in electrical and mechanical contact with said second electrode.

11. The phase change memory cell structure of claim 10 wherein said trilayer stack, including said first electrode is cylindrical in shape.

12. The phase change memory cell structure of claim 10, wherein:
    said flat thin film of said first electrode is disk shaped and is disposed at said normal angle with respect to said inner surface of said phase change element; and
    said first electrode includes a portion oriented so that contact thereof with said phase change element provides a conductive shunting path.

13. The phase change memory cell structure of claim 10, wherein:
said first electrode comprises a planar structure with a periphery formed on said upper surface of a lower dielectric layer and below an upper dielectric layer; and
said phase change element covers said upper region of said first dielectric layer and said sidewalls.

14. The phase change memory cell structure of claim 13 wherein said first electrode is oriented so that said contact with said phase change element provides a conductive shunting path.

15. A phase change memory cell, comprising:
a trilayer stack including an upper region of a first dielectric layer having a central upper surface which is flat and extends horizontally, a first electrode which is a planar, flat, thin film that is electrically conductive and having a top surface, with said first electrode formed on top of said central upper surface, and an insulating cap comprising a dielectric layer formed on said top surface of said first electrode;
a via conductor extending through said first dielectric layer with said via conductor having an exposed top end coplanar with said central upper surface;
said first dielectric layer having a recessed surface lower than said central upper surface aside from said central upper surface;
said insulating cap, said thin film lower electrode, and said upper region of said first dielectric layer having aligned vertical sidewalls extending between said central upper surface and said recessed surface surrounding said trilayer stack;
said first electrode having a lower surface in contact with said exposed top end of said via conductor;
said insulating cap formed on said top surface of said first electrode above said central upper surface;
a second electrode which is electrically conductive;
a phase change element formed over said insulating cap between said first electrode and said second electrode with at least a portion of said periphery of said first electrode in electrical and mechanical contact with said first electrode at an angle normal to an inner plane of said phase change element and said phase change element surrounding said vertical sidewalls of said trilayer stack;
said second electrode being in electrical and mechanical contact with an outer plane of said phase change element;
said first electrode being separated from said second electrode; and
said phase change element formed over said upper surface of said insulating cap, over said aligned vertical sidewalls of said first dielectric layer, over said vertical sidewalls of said insulating cap and over said periphery of said first electrode;
whereby said phase change element is electrically connected to said peripheral sidewalls of said first electrode.

16. The phase change memory cell structure of claim 15, wherein said first electrode is disk shaped.

17. The phase change memory cell structure of claim 15, wherein:
said first electrode is disk shaped and is disposed at an angle with respect to a surface of said phase change element; and
said first electrode includes a portion oriented so that contact thereof with said phase change element provides a conductive shunting path.

18. The phase change memory cell structure of claim 15, wherein:
said first electrode comprises a planar structure with a periphery and which is formed on said upper region of said first dielectric layer and below said insulating cap with said first dielectric layer and said insulating cap having vertical sidewalls; and
said phase change element covers said insulating cap and said vertical sidewalls and is in electrical contact with said periphery of said thin film lower electrode.

19. The phase change memory cell structure of claim 18, wherein said first electrode is oriented so that said contact with said phase change element provides a conductive shunting path.

20. The phase change memory cell structure of claim 19 wherein said trilayer stack including said first electrode comprises a lower conductor which can have either a round or a rectangular periphery.

* * * * *